US012622037B2

(12) United States Patent
Park et al.

(10) Patent No.:   US 12,622,037 B2
(45) Date of Patent:        May 5, 2026

(54) GATE CUT SUBSEQUENT TO REPLACEMENT GATE

(71) Applicant: International Business Machines Corporation, Armonk, NY (US)

(72) Inventors: Chanro Park, Clifton Park, NY (US); Andrew M. Greene, Slingerlands, NY (US); Andrew Gaul, Halfmoon, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 615 days.

(21) Appl. No.: 17/524,541

(22) Filed: Nov. 11, 2021

(65) Prior Publication Data

US 2023/0143317 A1     May 11, 2023

(51) Int. Cl.
H10D 64/27          (2025.01)
H10D 64/01          (2025.01)
(52) U.S. Cl.
CPC ........... H10D 64/517 (2025.01); H10D 64/01 (2025.01)
(58) Field of Classification Search
CPC ....... H10D 64/517–519; H10D 62/113; H10D 30/024; H10D 30/6211; H10D 84/0158; H01L 29/42376; H01L 29/4238; H01L 29/0642; H01L 29/66795; H01L 29/66045; H01L 29/66409; H01L 29/66446; H01L 29/7851; H01L 21/823431; H01L 21/8256; H01L 21/8206; H01L 21/8213; H01L 21/8252; H01L 21/8254; H01L 21/8258
See application file for complete search history.

(56) References Cited

U.S. PATENT DOCUMENTS

| | | | |
|---|---|---|---|
| 9,064,932 | B1 | 6/2015 | Pham |
| 9,508,727 | B2 | 11/2016 | Park |
| 10,586,860 | B2 | 3/2020 | Shu |
| 10,770,571 | B2 | 9/2020 | Hsu |
| 10,790,372 | B2 | 9/2020 | Greene |
| 10,833,077 | B2 | 11/2020 | Hung |

(Continued)

OTHER PUBLICATIONS

A. Greene et al., "Gate-Cut-Last in RMG to Enable Gate Extension Scaling and Parasitic Capacitance Reduction," 2019 Symposium on VLSI Technology, 2019, pp. T144-T145, doi: 10.23919/VLSIT. 2019.8776493.

(Continued)

*Primary Examiner* — Joseph C. Nicely
(74) *Attorney, Agent, or Firm* — Seed Intellectual Property Law Group LLP

(57)                ABSTRACT

A semiconductor device includes a first gate upon a semiconductor substrate and a second gate upon the semiconductor substrate in line with the first gate. A gate cut dielectric is between the first gate and the second gate. A first gate cap is upon a top surface of the first gate and a second gate cap is upon a top surface of the second gate. A gate cut multilayer structure is between the first gate cap and the second gate cap. The gate cut multilayer structure includes a dielectric between a first substantially vertical spacer and a second substantially vertical spacer. A first sidewall of the multilayer structure is coplanar with an end of the first gate and a second opposing sidewall of the multilayer structure is coplanar with an end of the second gate.

20 Claims, 26 Drawing Sheets

(56) References Cited

U.S. PATENT DOCUMENTS

| | | | | |
|---|---|---|---|---|
| 10,854,603 | B2 * | 12/2020 | Hsueh | H10D 64/017 |
| 12,094,877 | B2 * | 9/2024 | Hsueh | H10D 84/038 |
| 12,255,205 | B2 * | 3/2025 | Wang | H10D 84/0158 |
| 2017/0084723 | A1 | 3/2017 | Greene | |
| 2017/0148682 | A1 | 5/2017 | Basker | |
| 2018/0144988 | A1 * | 5/2018 | Liou | H10D 30/024 |
| 2019/0244865 | A1 * | 8/2019 | Xu | H10D 84/038 |
| 2019/0355832 | A1 * | 11/2019 | Shu | H10D 84/0151 |
| 2019/0393324 | A1 * | 12/2019 | Chen | H01L 21/76224 |
| 2022/0415888 | A1 * | 12/2022 | Hsieh | H10D 84/0158 |
| 2022/0416057 | A1 * | 12/2022 | Bouche | H10D 84/038 |
| 2025/0125150 | A1 * | 4/2025 | Chen | H10D 84/0193 |

OTHER PUBLICATIONS

IPCOM000245702D, "Self-Aligned Gate Isolation Process for FINFET CMOS beyond 10nm" Disclosed Anonymously, Mar. 31, 2016.
IPCOM000248270D, "Gate Cut after Replacement Metal Gate with Air Gap Formation" Disclosed Anonymously, Nov. 14, 2016.

* cited by examiner 100 or 200

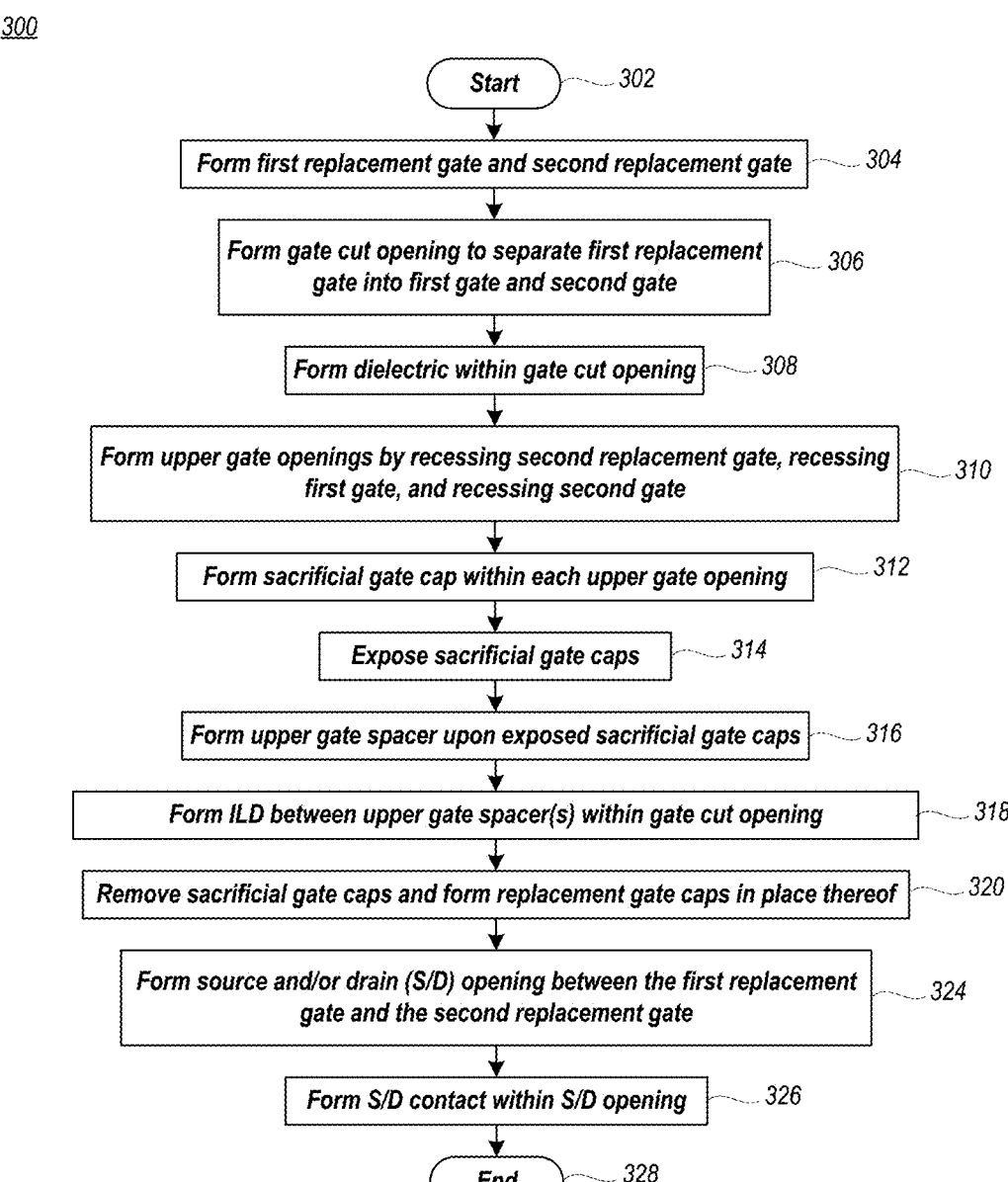

*300*

Start —— *302*

Form first replacement gate and second replacement gate —— *304*

Form gate cut opening to separate first replacement gate into first gate and second gate —— *306*

Form dielectric within gate cut opening —— *308*

Form upper gate openings by recessing second replacement gate, recessing first gate, and recessing second gate —— *310*

Form sacrificial gate cap within each upper gate opening —— *312*

Expose sacrificial gate caps —— *314*

Form upper gate spacer upon exposed sacrificial gate caps —— *316*

Form ILD between upper gate spacer(s) within gate cut opening —— *318*

Remove sacrificial gate caps and form replacement gate caps in place thereof —— *320*

Form source and/or drain (S/D) opening between the first replacement gate and the second replacement gate —— *324*

Form S/D contact within S/D opening —— *326*

End —— *328*

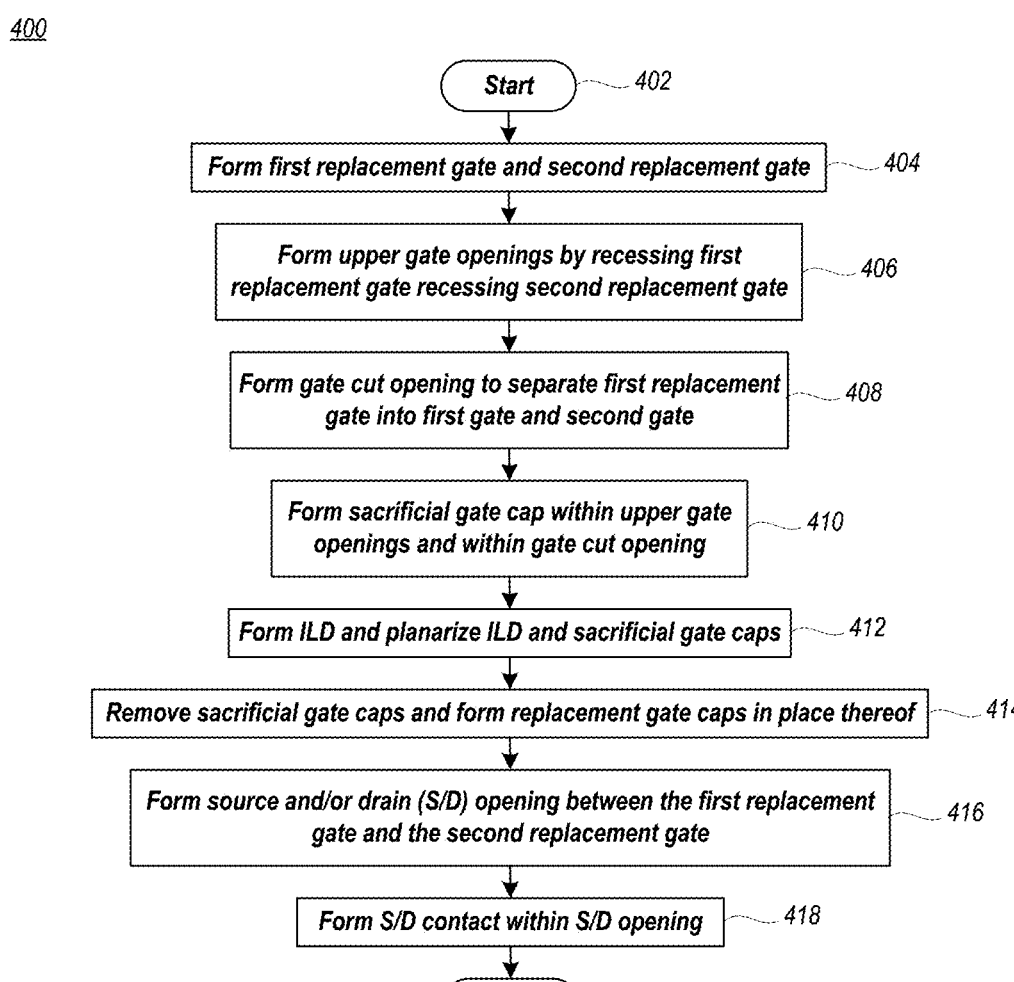

Start —— 402

Form first replacement gate and second replacement gate —— 404

Form upper gate openings by recessing first replacement gate recessing second replacement gate —— 406

Form gate cut opening to separate first replacement gate into first gate and second gate —— 408

Form sacrificial gate cap within upper gate openings and within gate cut opening —— 410

Form ILD and planarize ILD and sacrificial gate caps —— 412

Remove sacrificial gate caps and form replacement gate caps in place thereof —— 414

Form source and/or drain (S/D) opening between the first replacement gate and the second replacement gate —— 416

Form S/D contact within S/D opening —— 418

End —— 420

FIG. 26

GATE CUT SUBSEQUENT TO REPLACEMENT GATE

BACKGROUND

Various embodiments of the present application generally relate semiconductor device fabrication methods and resulting structures. More specifically the various embodiments relate to a semiconductor device that includes a gate cut region that is fabricated after fabrication of an associated replacement gate.

SUMMARY

In an embodiment of the present invention, a semiconductor device is presented. The semiconductor device includes a first replacement gate upon a semiconductor substrate. The semiconductor device further includes a gate cut region that separates the first replacement gate into a first gate and a second gate. The semiconductor device further includes a gate cut dielectric within the gate cut region. The semiconductor device further includes a first gate cap upon a top surface of the first gate and a second gate cap upon a top surface of the second gate. The semiconductor device further includes a gate cut multilayer structure between the first gate cap and the second gate cap. The gate cut multilayer structure includes a dielectric between a first spacer and a second spacer. A first sidewall of the multilayer structure is coplanar with an end of the first gate and a second opposing sidewall of the multilayer structure is coplanar with an end of the second gate.

In an embodiment of the present invention, another semiconductor device is presented. The semiconductor device includes a first gate upon a semiconductor substrate and a second gate upon the semiconductor substrate in line with the first gate. The semiconductor device further includes a gate cut dielectric between the first gate and the second gate. The semiconductor device further includes a first gate cap upon a top surface of the first gate and a second gate cap upon a top surface of the second gate. The semiconductor device further includes a gate cut multilayer structure between the first gate cap and the second gate cap. The gate cut multilayer structure includes a dielectric between a first vertical spacer and a second vertical spacer. A first sidewall of the multilayer structure is coplanar with an end of the first gate and a second opposing sidewall of the multilayer structure is coplanar with an end of the second gate.

In another embodiment of the present invention, a semiconductor device fabrication method is presented. The method includes forming a first gate upon a semiconductor substrate and forming a second gate upon the semiconductor substrate in line with the first gate. The method further includes forming a gate cut dielectric between the first gate and the second gate. The method further includes forming a first gate cap upon a top surface of the first gate and forming a second gate cap upon a top surface of the second gate. The method further includes forming a gate cut multilayer structure between the first gate cap and the second gate cap. The gate cut multilayer structure includes a dielectric between a first vertical spacer and a second vertical spacer. A first sidewall of the multilayer structure is coplanar with an end of the first gate and a second opposing sidewall of the multilayer structure is coplanar with an end of the second gate.

These and other embodiments, features, aspects, and advantages will become better understood with reference to the following description, appended claims, and accompanying drawings.

BRIEF DESCRIPTION OF THE DRAWINGS

FIG. 25 is a flow diagram illustrating a semiconductor device fabrication method, in accordance with one or more embodiments.

FIG. 26 is a flow diagram illustrating a semiconductor device fabrication method, in accordance with one or more embodiments.

DETAILED DESCRIPTION

Figure 1:
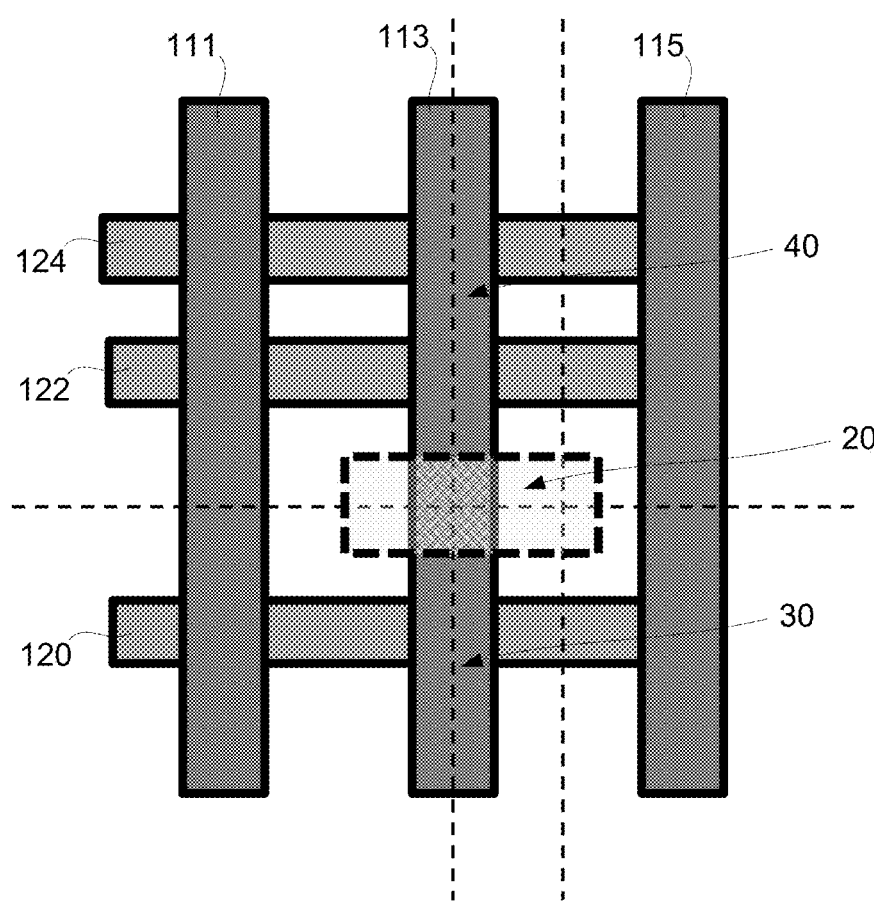
FIG. 1 defines various cross-sectional views of one or more semiconductor devices, in accordance with one or more embodiments.

It is understood in advance that although a detailed description is provided herein of an exemplary field effect transistor (FET) architecture that includes a gate cut region that is fabricated after fabrication of an associated replacement gate, implementation of the teachings recited herein are not limited to the particular FET architecture described herein. Rather, embodiments of the present invention are capable of being implemented in conjunction with any other appropriate type of FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "X" upon layer "Y" include situations in which one or more intermediate layers (e.g., layer "Z") is between layer "X" and layer "Y" as long as the relevant characteristics and functionalities of layer "X" and layer "Y" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor FETs (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

Referring to FIG. 1 that defines cross-sectional views of semiconductor device 100 and/or semiconductor device 200 that includes at least a replacement gate structure 113 and a gate cut region 20 that cuts the replacement gate structure 113 into a separate or distinct (e.g., not physically connected, independently electrically connected, or independently electrically controlled, or the like) first gate 30 and a second gate 40. Semiconductor device 100 and/or semiconductor device 200 may further include replacement gate structure 111, replacement gate structure 115, fin 120, fin 122, and/or fin 124. Cross-section A, cross-section B, and cross-section C are defined as depicted through at least gate cut region 20. For example, cross-section A may be a cross-section through replacement gate structure 111, through replacement gate structure 113, through replacement gate structure 115, and through gate cut region 20. Cross-section B may be a cross-section through replacement gate structure 113 and through gate cut region 20. Similarly, cross-section C may be a cross-section through fin 120, fin 122, fin 124, and through gate cut region 20. The cross-sectional planes A, B, and C may be referenced in the cross-sectional views of semiconductor device 100 and/or semiconductor device 200 at various fabrication stages, as depicted in FIG. 2 through FIG. 24.

Figure 2:
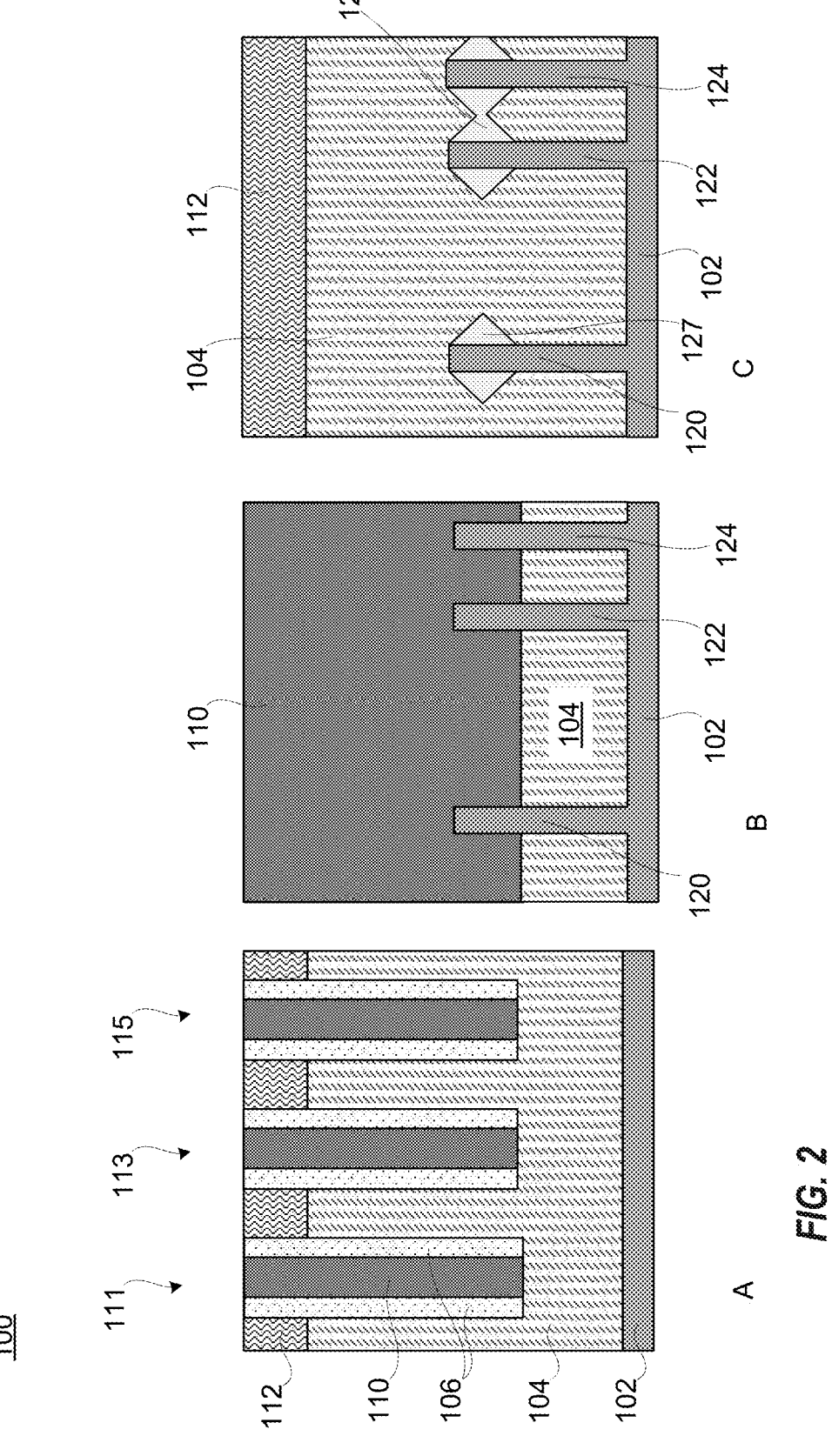
FIG. 2 through FIG. 15 depicts cross-sectional views of a semiconductor device shown after one or more fabrication operations, in accordance with one or more embodiments.

FIG. 2 depicts cross-sectional views of a semiconductor device 100 shown after initial fabrication operations, in accordance with one or more embodiments. After the initial fabrication operations, semiconductor device 100 may include a substrate 102, dielectric 104, mask 112, replacement gate structures 111, 113, 115, and fins 120, 122, 124. Each replacement gate structure may include a gate spacer 106 and a replacement gate 110.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a semiconductor on insulator (SOI) substrate that includes a base substrate layer 102, a buried oxide (BOX) layer (portion of dielectric 104 shown in cross-section B) on the base substrate layer 102, and an upper semiconductor layer (portion of dielectric 104 above the BOX layer) upon the BOX layer.

Utilizing known patterning, lithography, etching, etc. techniques, undesired portions of the substrate 102 may be removed while desired portions thereof may be retained and may form fins 120, 122, and/or 124. Fins 120, 122, and/or 124 can be patterned by conventional patterning techniques, such as Self-Aligned Double Patterning (SADP), Self-Aligned Quadruple Patterning (SAQP), etc.

STI regions, e.g. portion of dielectric 104 depicted in cross-section B, may be formed by depositing a dielectric known in the art, upon the substrate 102 and upon and between fins 120, 122, 124. The STI regions may be formed by depositing the STI material by for example, PVD, CVD, ALD, or the like, followed by chemical mechanical polish (CMP) and STI regions recess to reveal the desired portion(s) of fins 120, 122, 124. As is known in the art, STI regions may, at least partially, electrically isolate neighboring FET components or features. Exemplary STI region material(s) may be $SiO_2$, a thin layer of conformal silicon nitride (SiN) and Silicon Dioxide ($SiO_2$), or the like.

Sacrificial gates (not shown) may be formed upon STI region(s) and upon and between fins 120, 122, 124. Sacrificial gates may be formed by depositing sacrificial gate material, materials, or layers of material(s), by PVD, CVD, ALD, or the like. Exemplary sacrificial gate materials may be amorphous.Si, or the like. In some embodiments, a sacrificial gate material layer may be formed upon the STI region and above and around fin(s) 120, 122, 124. Subsequently a gate mask layer may be formed upon the sacrificial gate material layer. The gate mask layer may be a hard mask layer. Exemplary gate mask layer materials may be SiN, a combination of SiN and $SiO_2$, or the like.

Utilizing known patterning, lithography, etching, etc. techniques, undesired portions of the gate mask may be removed, followed by further removal of the sacrificial gate material layer that is not covered by the gate mask, while desired portions of sacrificial gate material layer and associated desired portions of the gate mask layer may be retained. These retained features may respectively form sacrificial gates with a gate mask thereupon. The combined structure of the sacrificial gate and the associated gate mask may be referred herein as a sacrificial gate structure.

Gate spacer 106 may be formed by forming a blanket spacer layer upon the STI region and around fin(s) 120, 122, 124. The gate spacer 106 layer can have a thickness of from about 1 nm to about 12 nm, although other thicknesses are within the contemplated scope. The gate spacer 106 layer can be a dielectric material, as is known in the art, different than sacrificial gate. Gate spacer 106 may be formed by depositing dielectric material(s) by CVD, ALD, or the like and shaping the gate spacer 106 dielectric material, such that gate spacer 106 is formed around the sidewall(s) of the sacrificial gate structure.

The gate spacer 106 may be shaped by removing horizontal portions of gate spacer 106 at horizontal surfaces. The horizontal portions of gate spacer 106 may be removed by known etching techniques, such as an anisotropic reactive ion etch (RIE). The desired vertical portions of gate spacer 106 may be associated with or juxtaposed against respective sidewalls of sacrificial gate(s). Further, undesired horizontal portions of gate spacer 106 may be associated with or above respective STI region and/or fin 120, 122, 124 upper surface(s). The shaped gate spacer 106 may therefore be effectively formed upon the vertical sidewalls of the sacrificial gate structure(s).

Source and/or drain (S/D) regions 127 may be formed by various processes known in the art. The S/D regions 127 may be formed around fins 120, 122, 124 in the region generally associated with cross-section C. For example, a diamond shaped epitaxially grown S/D region 127 may be grown around the fin 120 and/or a merged diamond shaped epitaxially grown S/D region 127 may be grown around the fins 122, 124.

An interlayer dielectric (ILD) (e.g., portion of dielectric 104 above ST region) may be formed by CVD, ALD, or the like around the S/D regions and/or 124 and between the sacrificial gate structures. The top surface of the ILD may be recessed and a mask 112 may be formed by CVD, ALD, or the like thereupon and between the sacrificial gate structures. Subsequently mask 112 may be a hard mask layer. Exemplary mask 112 materials may be SiN, $SiO_2$, a combination of SiN and $SiO_2$, or the like. The top surface of each of the sacrificial gates may be exposed by a chemical mechanical polish (CMP) or other known material removal technique that may planarize the top surface of the mask 112, the top surface of spacer 106, and the top surface of the sacrificial gate.

The exposed sacrificial gate may be removed by known removal techniques, such as etching. The removed sacrificial gate forms a gate opening defined generally by the inner sidewall(s) of gate spacer 106 and a lower well surface of STI region. A replacement gate structure 111, 113, or 115 may be formed within a respective gate opening.

Each replacement gate structure 111, 113, or 115 can include a gate dielectric (not shown) and gate conductor(s), which may also be referred to herein as, gate, replacement gate 110, or the like. The gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable deposition process or the like. In some embodiments, the gate dielectric has a thickness ranging from 1 nm to 5 nm, although less thickness and greater thickness are also conceived.

Gate dielectric may be formed upon the STI region and upon the inner facing sidewalls of spacer 106. Gate dielectric may be formed by known deposition techniques such PVD, CVD, ALD, or the like.

Gate conductor(s) may be formed upon gate dielectric. Gate conductor and/or gate conductor(s) can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition.

In some embodiments, the replacement gate structures 111, 113, 115 may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and the WFM. The gate conductor and the WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc.

Figure 3:
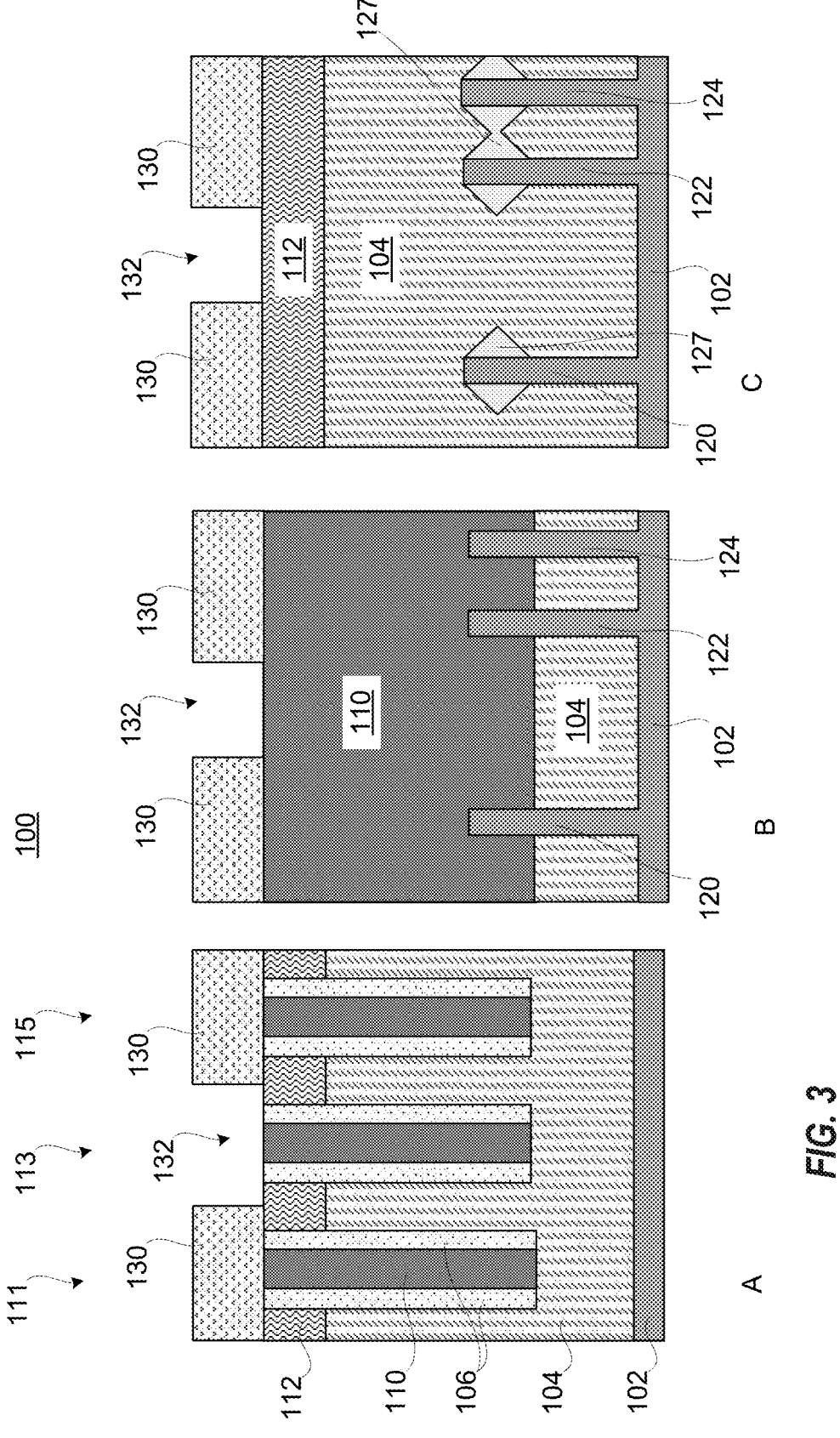

FIG. 3 depicts cross-sectional views of a semiconductor device 100 shown after a fabrication operation, in accordance with one or more embodiments. The current fabrication operation may include forming mask 130 and patterning mask 130 to form opening 132 therein that may define the gate cut region 20.

The mask 130 can be formed by any suitable process or any suitable combination of multiple processes, including but not limited to, ALD, CVD, PVD, or the like. The mask 130 may be formed upon mask 112, upon upper surface(s) of gate spacer(s) 106, upon replacement gates 110 associated with replacement gate structures 111, 113, and/or 115.

The mask 130 may be patterned by removing undesired portions thereof while retaining desired portions thereof. The portions of patterned mask 130 may effectively protect underlying regions of the semiconductor device 100 while the opening 132 may expose or otherwise define the underlying gate cut region 20 of semiconductor device 100. The mask 130 may be patterned by known lithography, etching, or other material removal techniques. The opening 132 within mask 130 exposes at least a portion of the upper surface of replacement gate 110 associated with replacement gate structure 113. Alternatively, as depicted, opening 132 exposes the upper surface of replacement gate structure 113 and a portion of the upper surface of mask 112 that surrounds the perimeter of replacement gate structure 113.

Figure 4:
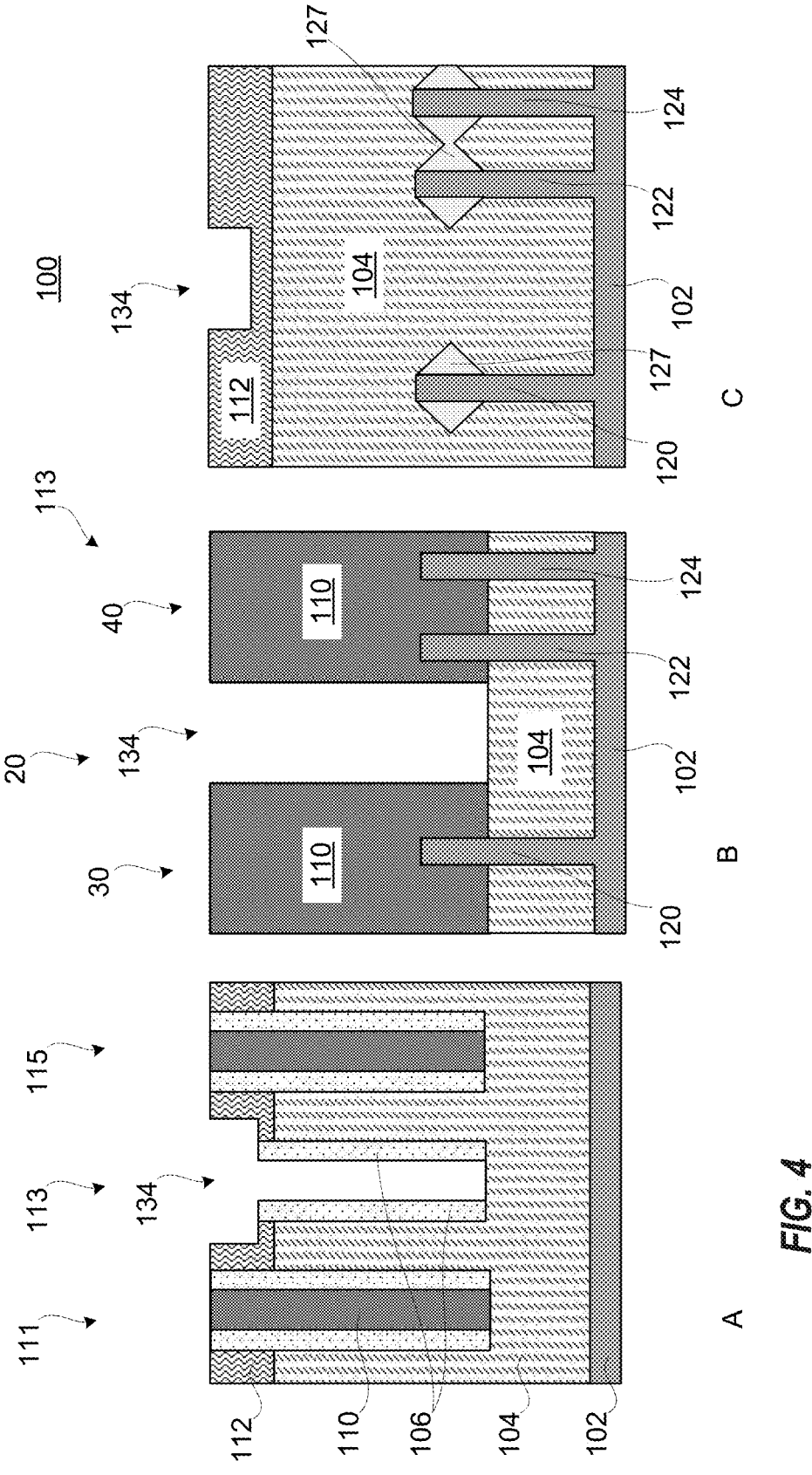

FIG. 4 depicts cross-sectional views of a semiconductor device 100 shown after a fabrication operation, in accordance with one or more embodiments. The current fabrication operation may include forming gate cut opening 134 and separating replacement gate structure 113 into first gate 30 and second gate 40. The perimeter of gate cut opening 134 may substantially correspond with the perimeter of opening 132 and may, therefore, define gate cut region 20.

Utilizing known removal techniques, the exposed replacement gate 110 associated with replacement gate structure 113 may be removed, thereby forming gate cut opening 134, while desired portions of replacement gate 110 associated with replacement gate structure 113 may be retained, thereby forming first gate 30 and second gate 40. For example, a etchant with selectivity to the material(s) of mask 112 and gate spacer 106 may remove the exposed replacement gate 110, associated with replacement gate structure 113, while leaving the material(s) of mask 112 and gate spacer 106 largely, adequately, or suitably intact.

Gate cut opening 134 may expose the inner facing sidewall(s) of spacer 106, may expose respective ends of first gate 30 and second gate 40, and may expose a lower well surface of dielectric 104 (e.g., an upper surface of the STI region). As such, gate cut opening 134 may fully physically separate the first gate 30 from the second gate 40.

Figure 5:
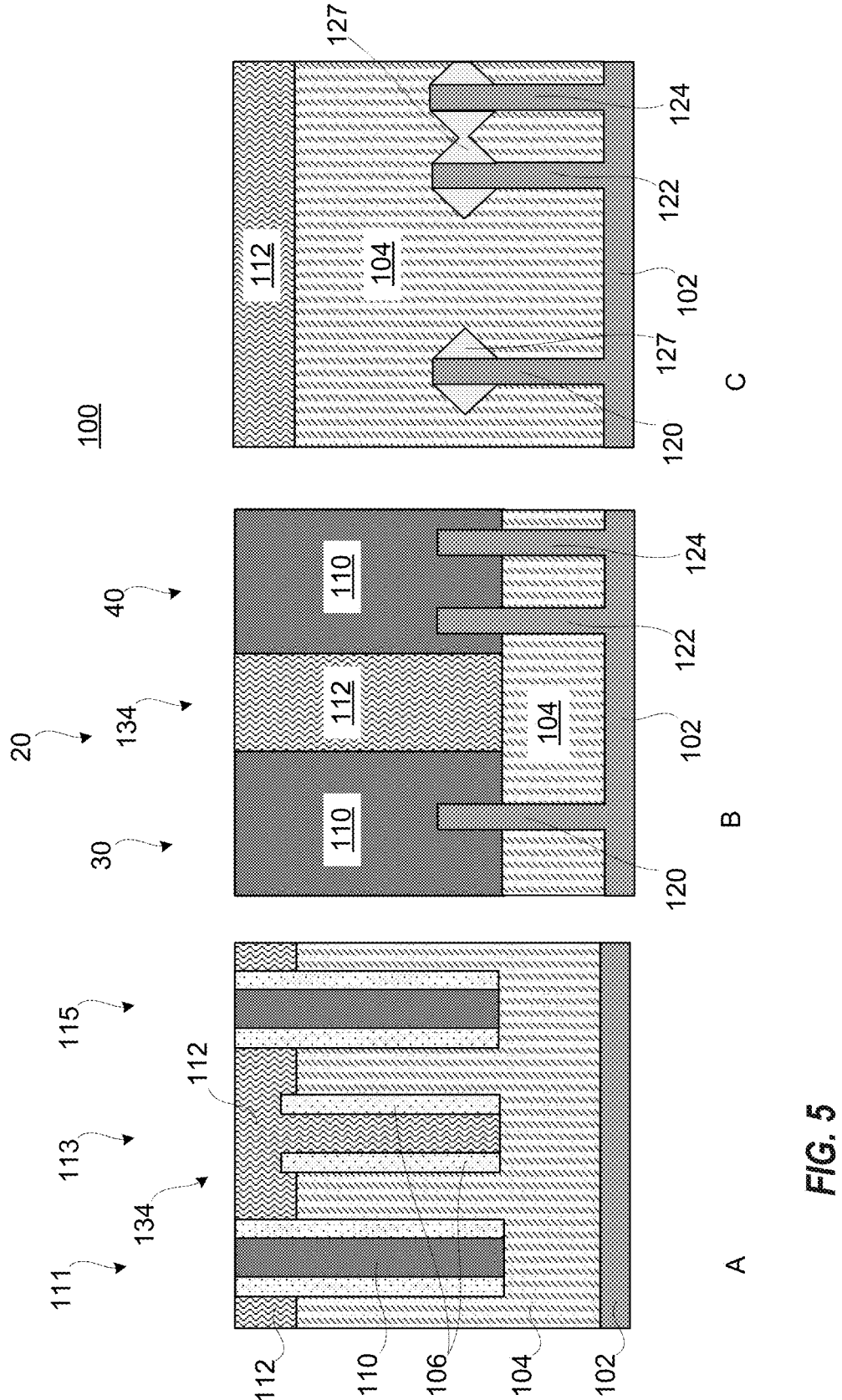

FIG. 5 depicts cross-sectional views of a semiconductor device 100 shown after a fabrication operation, in accordance with one or more embodiments. The current fabrication operation may include forming mask 112 within the gate cut opening 134 to thereby separate first gate 30 from second gate 40 with mask 112.

Mask 112 may be formed within gate cut opening 134 by CVD, ALD, or the like. The mask 112 that is formed within gate cut opening 134 may be the same material as the previous mask 112, as depicted. Alternatively, the mask 112 that is formed within gate cut opening 134 may be a different material as the previous mask 112. Subsequent to forming mask 112 within gate cut opening 134, the top surface mask 112 and the top surface of the replacement gate structures 111, 113, and 115 may be planarized by a CMP, or the like.

Figure 6:
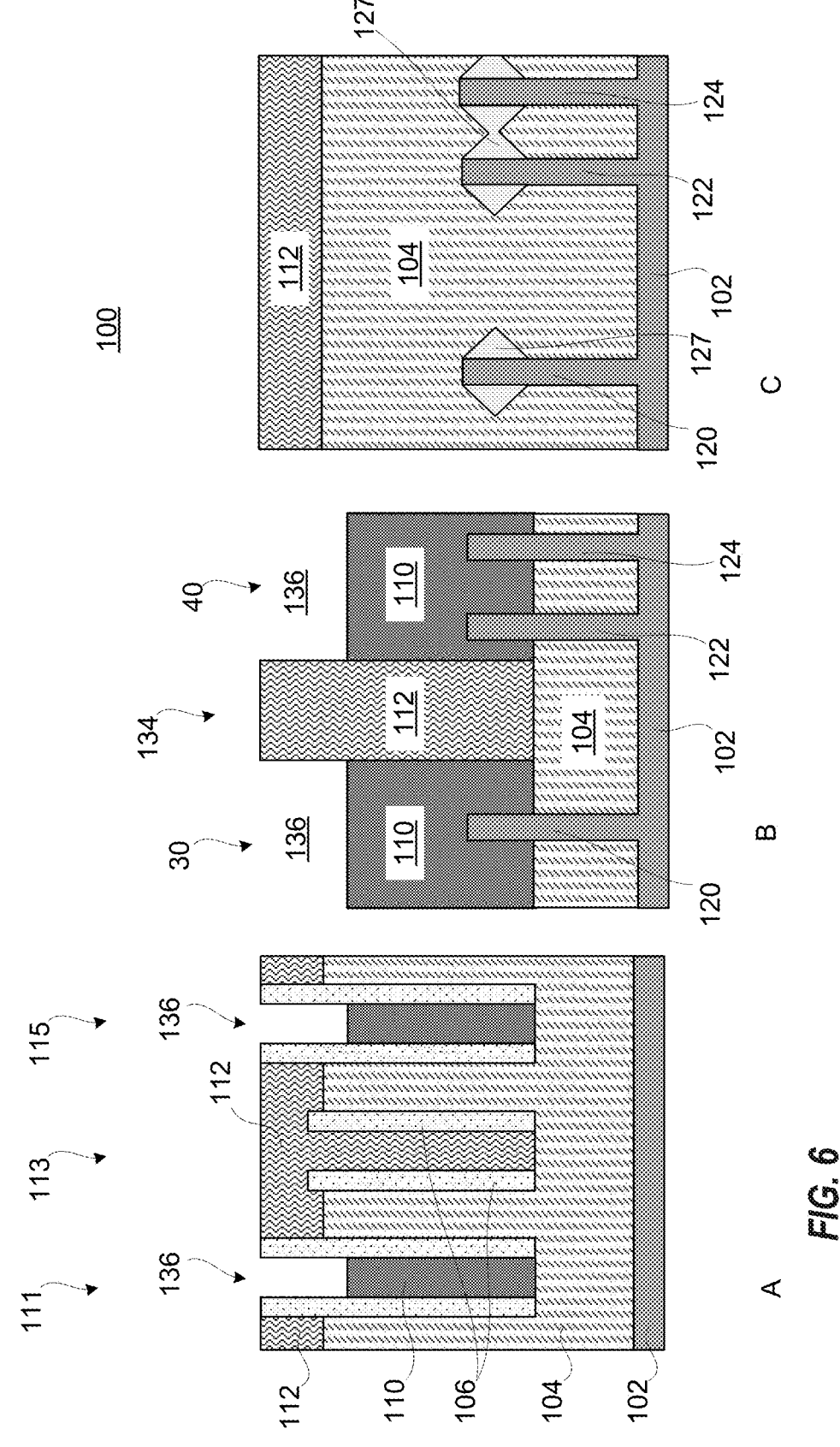

FIG. 6 depicts cross-sectional views of a semiconductor device 100 shown after a fabrication operation, in accordance with one or more embodiments. The current fabrication operation may include forming upper gate openings 136 by recessing the replacement gate 110 that is associated with replacement gate structure 111, that is associated with first gate 30, that is associated with second gate 40, and/or that is associated with replacement gate structure 115.

Utilizing known removal techniques, an upper portion of the exposed replacement gate(s) 110 may be removed, thereby forming upper gate opening 136, while a desired lower portion of replacement gate 110 may be retained. For example, a predetermined timed exposure to an etchant with selectivity to the material(s) of mask 112 and gate spacer 106 may remove the undesired upper portion of replacement gate 110, while leaving the material(s) of mask 112 and gate spacer 106 largely, adequately, or suitably intact. Exposure of semiconductor device 100 to the etchant may end, thereby leaving or retaining the desired lower portion(s) of replacement gate(s) 110. Upper gate opening 136 may expose at least an upper portion(s), only an upper portion(s), or the like, of inner facing sidewall(s) of spacer 106. In other words, upper gate opening 136 results from a partial recessing of replacement gate 110 (i.e., upper gate opening 136 leaves the desired lower portion of replacement gate 110 intact).

In an embodiment, as depicted, upper gate opening 136 is formed to a depth such that a lower well surface of upper gate opening is below an upper surface of the ILD (e.g., upper surface of dielectric 104), is below a lower surface of mask 112 as shown in the C cross-section, or the like.

Figure 7:
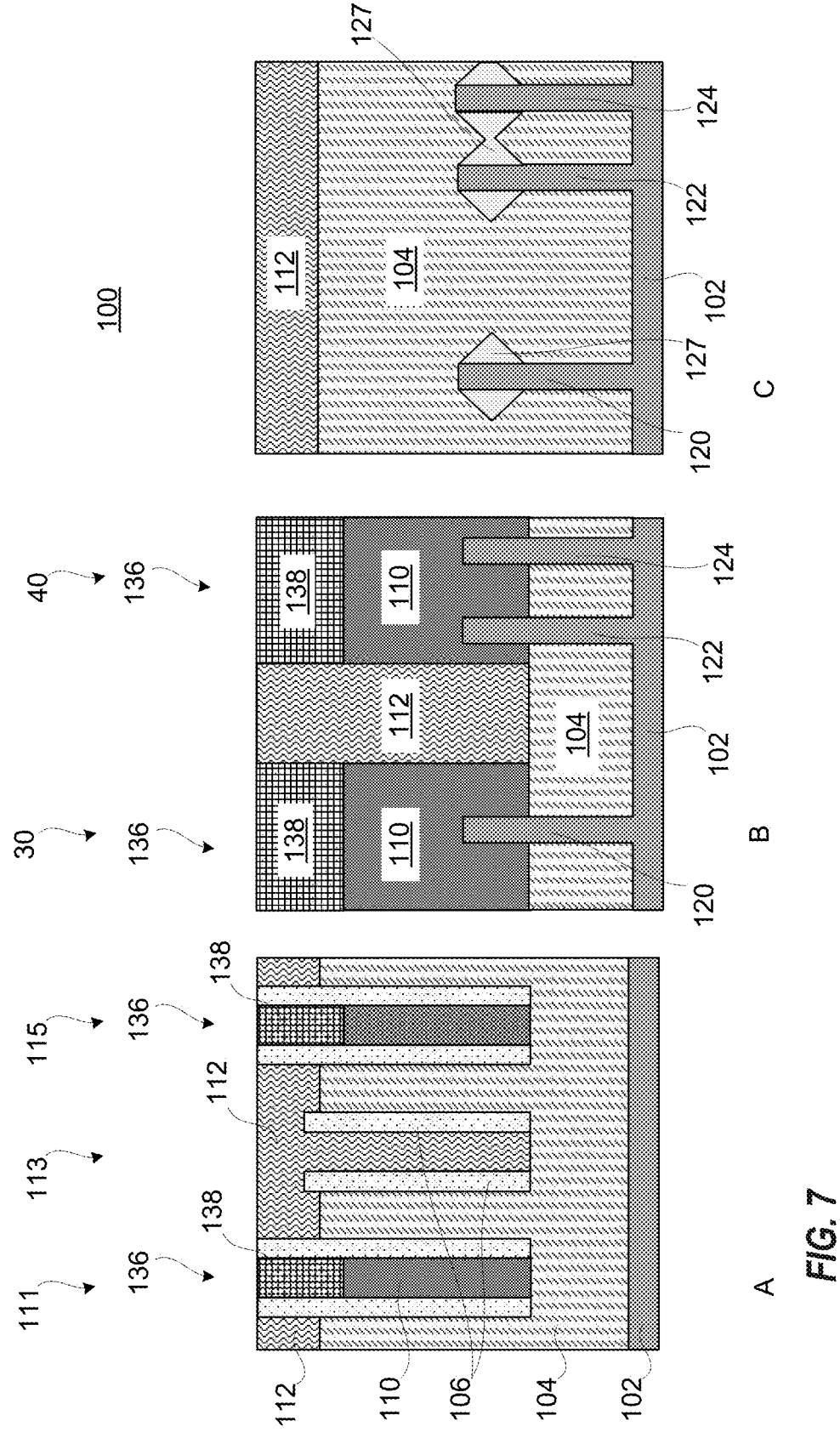

FIG. 7 depicts cross-sectional views of a semiconductor device 100 shown after a fabrication operation, in accordance with one or more embodiments. The current fabrication operation may include forming a sacrificial gate cap 138 within each upper gate opening 136. For example, sacrificial gate cap 138 is formed in the respective upper gate opening 136 that is associated with replacement gate structure 111, that is associated with first gate 30, that is associated with second gate 40, and/or that is associated with replacement gate structure 115.

Sacrificial gate cap 138 may be formed within upper gate opening 136 by CVD, ALD, or the like. The sacrificial gate cap 138 may be a sacrificial material, such as amorphous Si, or the like. Subsequent to forming sacrificial gate cap 138, the top surface mask 112, the top surface of the replacement gate structures 111, 113, and 115, the top surface of sacrificial gate cap 138 may be planarized by a CMP, or the like.

In an embodiment, as depicted, sacrificial gate cap 138 has a bottom surface that is below an upper surface of the ILD (e.g., upper surface of dielectric 104), is below a lower surface of mask 112 as shown in the C cross-section, or the like.

Figure 8:
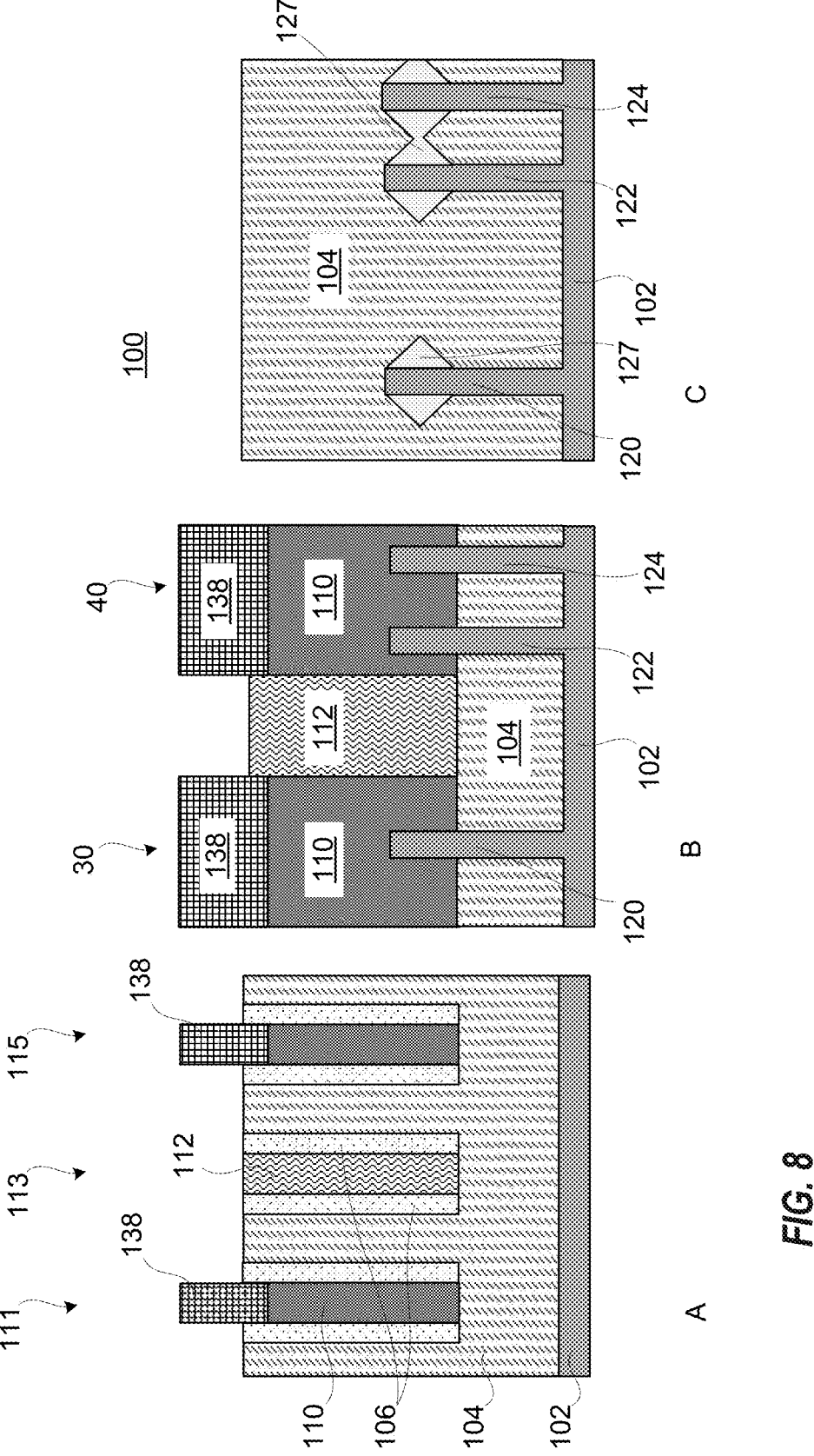

FIG. 8 depicts cross-sectional views of a semiconductor device 100 shown after a fabrication operation, in accordance with one or more embodiments. The current fabrication operation may include removing mask 112 that is above the upper surface of the ILD (e.g., upper surface of dielectric 104) and partially recessing gate spacers 106, thereby at least partially exposing sacrificial gate cap 138.

Utilizing known removal techniques, the mask 112 that is above the upper surface of the ILD may be removed while the mask 112 that is below the upper surface of the ILD (i.e., mask 112 that separates first gate 30 from second gate 40 within replacement gate structure 113) may be retained. For example, an wet or dry etch that removes mask 112 may be utilized with the dielectric 104 as an etch stop to remove the mask 112 above the upper surface of the ILD while the mask 112 below the upper surface of the ILD is retained.

In some embodiments, as depicted, the upper surface of the retained mask 112 may be above the first gate 30 and the second gate 40 that are associated with the replacement gate structure 113.

Figure 9:
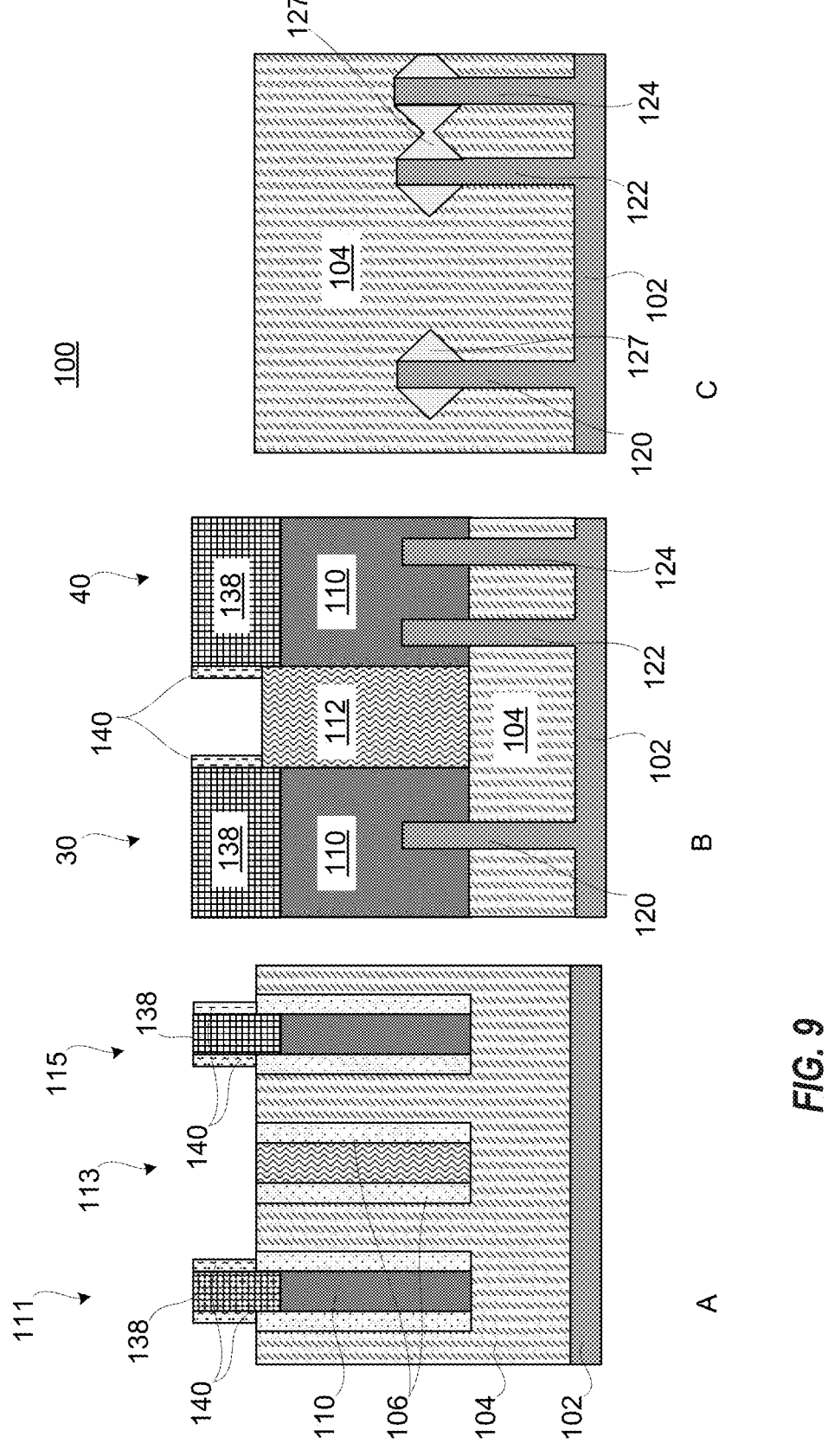

FIG. 9 depicts cross-sectional views of a semiconductor device 100 shown after a fabrication operation, in accordance with one or more embodiments. The current fabrication operation may include forming upper gate spacer 140 upon gate spacer 106, upon sacrificial gate cap 138, and/or upon mask 112.

Upper gate spacer 140 may be formed by forming a blanket spacer layer upon the ILD (e.g., upon the upper surface of dielectric 104), upon sacrificial gate cap 138, and upon mask 112. The upper gate spacer 140 layer can have a thickness of from about 2 nm to about 6 nm, although other thicknesses are within the contemplated scope. The upper gate spacer 140 generally may have a thickness less than the thickness of gate spacer 106 away from gate 110. The upper gate spacer 140 can be an etch-resistant high-k dielectric material (a material with a greater dielectric constant compared to silicon dioxide), such as $HfO_2$, $AlO_x$, or the like. Upper gate spacer 140 may be formed by depositing dielectric material(s) by CVD, ALD, or the like and shaping the upper gate spacer 140 dielectric material, such that upper gate spacer 140 is formed around the sidewall(s) of the sacrificial gate cap 138.

The upper gate spacer 140 may be shaped by removing horizontal portions of upper gate spacer 140 at horizontal surfaces. The horizontal portions of upper gate spacer 138 may be removed by known etching techniques, such as an RIE. The desired vertical portions of upper gate spacer 140 may be associated with or juxtaposed against respective sidewalls of sacrificial gate cap 138. The shaped upper gate spacer 140 may therefore be effectively formed upon the substantially vertical sidewalls of the sacrificial gate cap 138.

Figure 10:
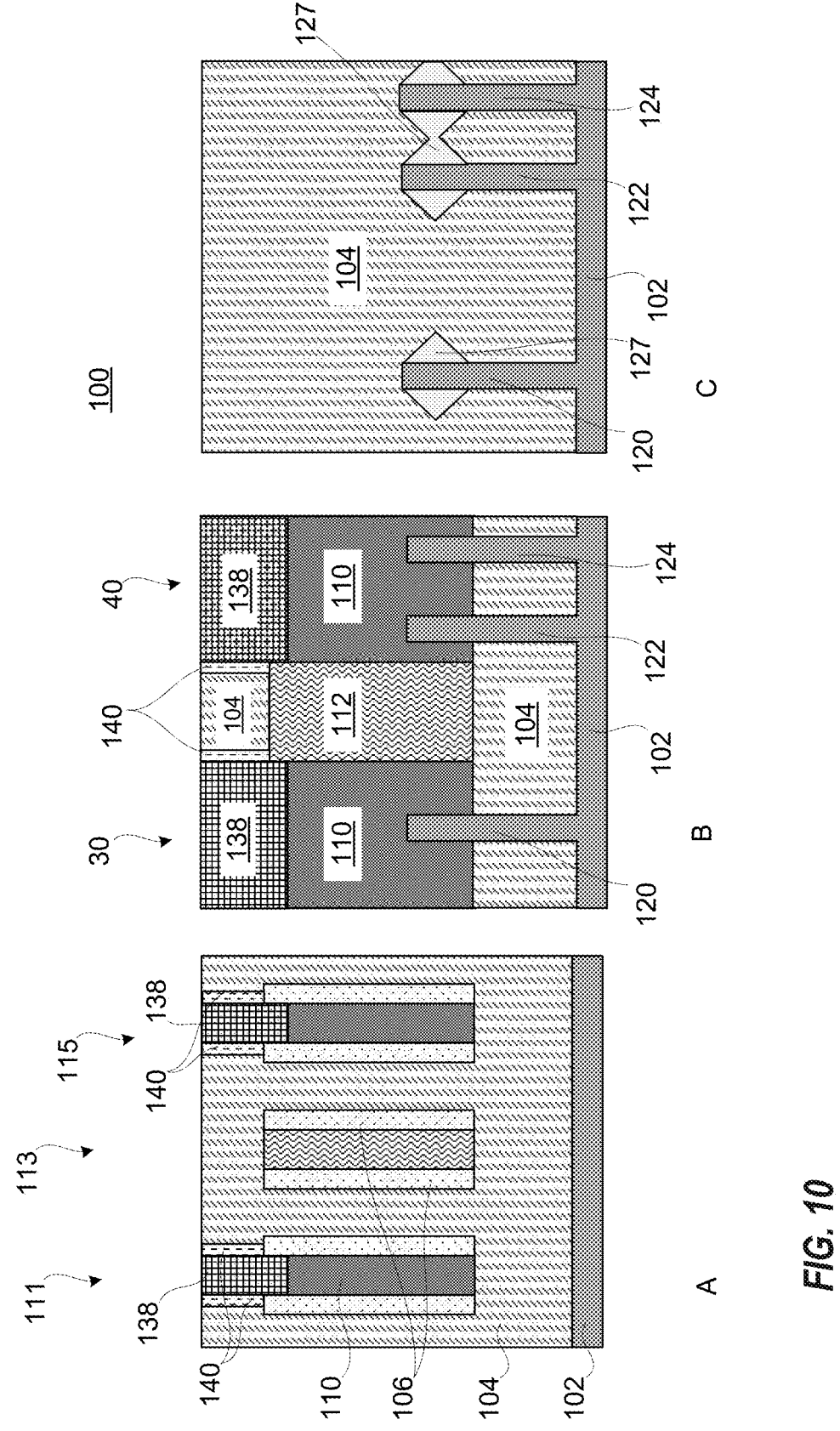

FIG. 10 depicts cross-sectional views of a semiconductor device 100 shown after a fabrication operation, in accordance with one or more embodiments. The current fabrication operation may include forming an ILD upon dielectric 104, upon gate spacer 106, upon upper gate spacer 140, upon sacrificial gate cap 138, and/or upon mask 112.

The ILD (e.g., depicted portion of dielectric 104 above mask 112) may be formed by CVD, ALD. The top surface of the ILD may be recessed or planarized with the top surface of upper gate spacer 140 and/or the top surface of sacrificial gate cap 138. Exemplary ILD materials may be SiN, $SiO_2$, a combination of SiN and $SiO_2$, or the like. The top surface of the ILD, the top surface of the upper gate spacer 140, and/or the top surface of sacrificial gate cap 138 may be planarized by a CMP. In the depicted embodiment, the contemporaneously formed ILD may be the same material as dielectric 104. As depicted in the B cross-section, the ILD may be formed upon mask 112 and upon and between upper gate spacer 140.

Figure 11:
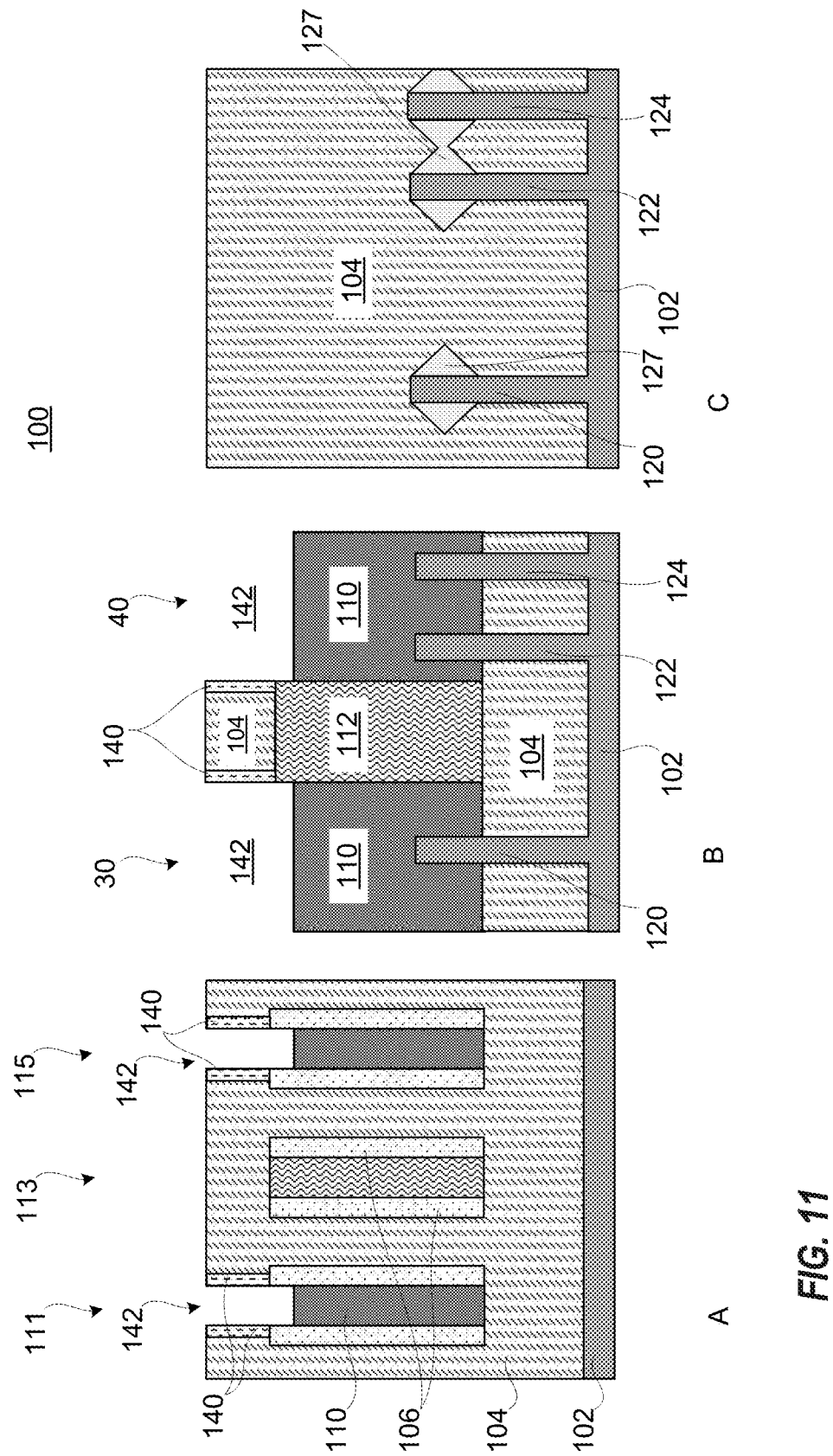

FIG. 11 depicts cross-sectional views of a semiconductor device 100 shown after a fabrication operation, in accordance with one or more embodiments. The current fabrication operation may include forming upper gate opening 142 by removing sacrificial gate cap 138.

Utilizing known removal techniques, sacrificial gate cap 138 may be removed to expose the upper surface of the lower portion of replacement gate 110. For example, a etchant with selectivity to the material(s) of dielectric 104, upper gate spacer 140, gate spacer 106, and replacement gate 110 may remove sacrificial gate cap 138 while leaving these materials adequately, fully, substantially intact. Upper gate opening 142 may expose at least an upper portion(s), only an upper portion(s), or the like, of inner facing sidewall(s) of spacer 106, may expose the inner sidewall(s) of upper gate spacer 140, may expose an upper portion of mask 112 that is between first fin 30 and second fin 40.

In an embodiment, as depicted, upper gate opening 142 is formed to a depth such that a lower well surface of upper gate opening 142 is below an upper surface of gate spacer 106.

Figure 12:
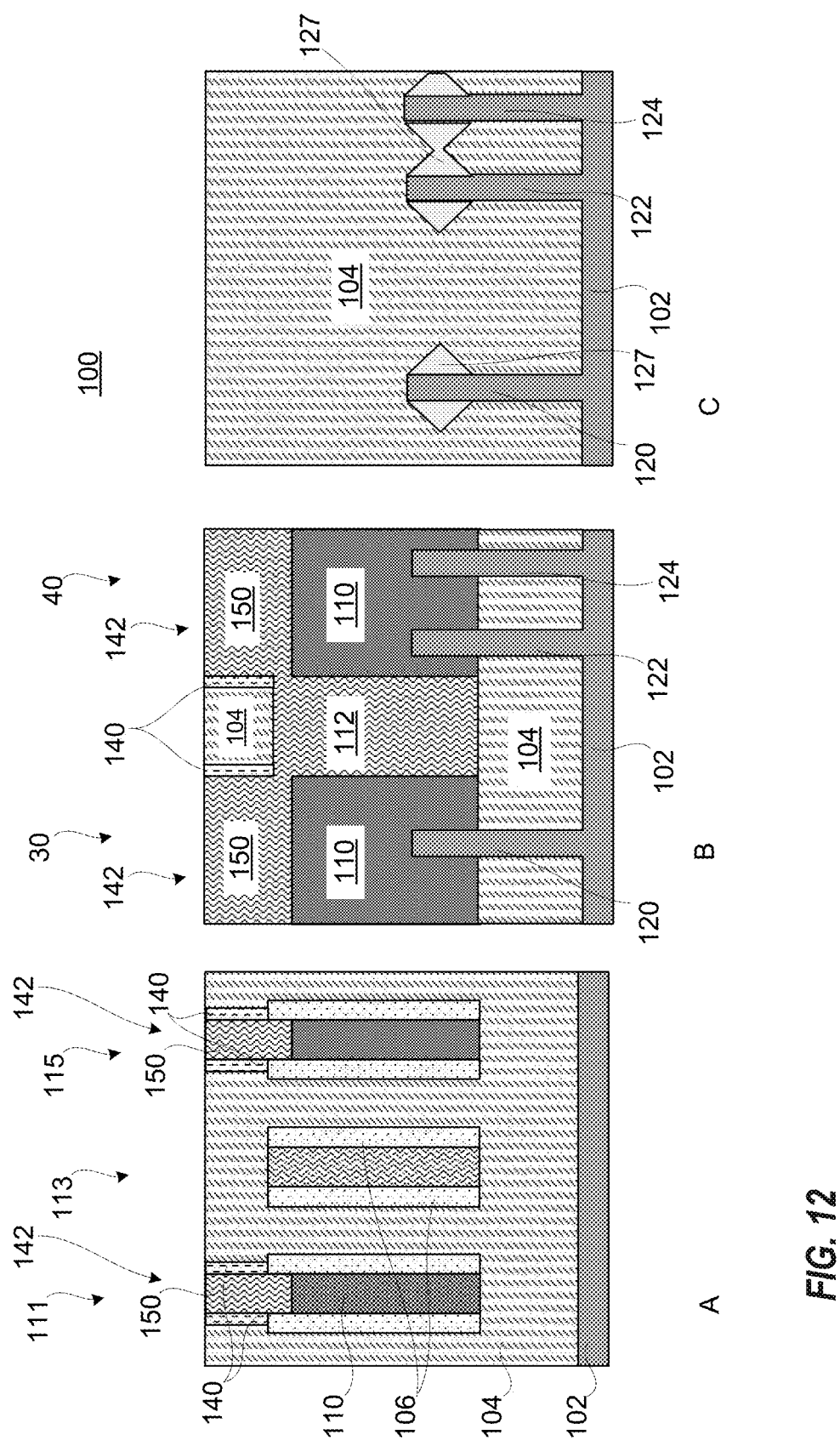

FIG. 12 depicts cross-sectional views of a semiconductor device 100 shown after a fabrication operation, in accordance with one or more embodiments. The current fabrication operation may include forming a gate cap 150 within upper gate opening 142. For example, gate cap 150 is formed in the respective upper gate opening 142 that is associated with replacement gate structure 111, that is associated with first gate 30, that is associated with second gate 40, and/or that is associated with replacement gate structure 115.

Gate cap 150 may be formed within upper gate opening 142 by CVD, ALD, or the like. The gate cap 150 may be a dielectric material, such as SiN, $SiO_2$, a combination of SiN and $SiO_2$, or the like. In the depicted embodiment, the gate cap 150 material may be the same material as mask 112 that is between replacement gate structure 113 first gate 30 and second gate 40. Subsequent to forming gate cap 150, the top surface of gate cap 150, the top surface of the replacement gate structures 111, 113, and 115, the top surface of upper gate spacer 140 may be planarized by a CMP, or the like. In an embodiment, as depicted, gate cap 150 has a bottom surface that is below an upper surface of gate spacer 106.

Figure 13:
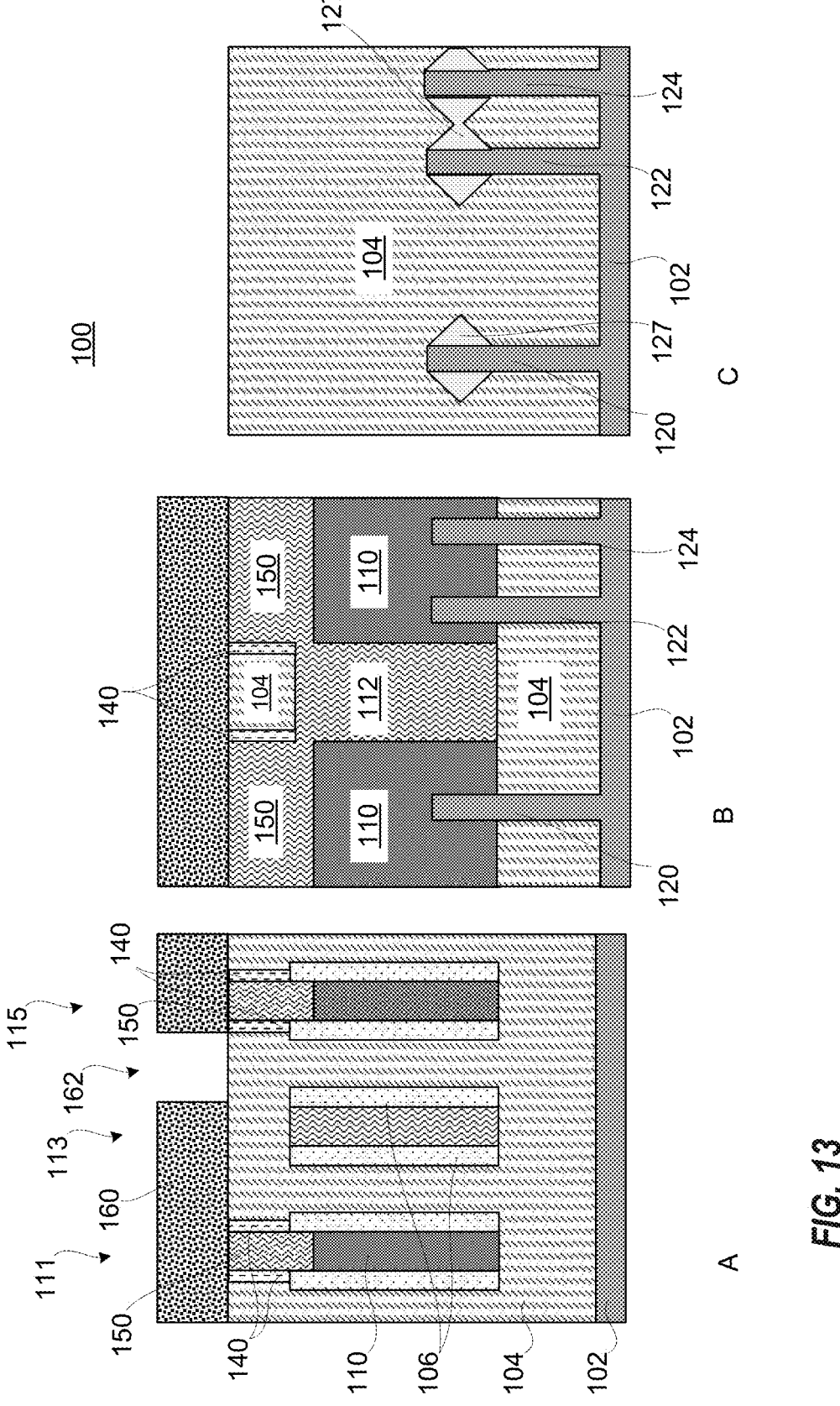

FIG. 13 depicts cross-sectional views of a semiconductor device 100 shown after a fabrication operation, in accordance with one or more embodiments. The current fabrication operation may include forming a mask 160 upon the ILD (e.g., top surface of dielectric 104), upon the top surface of upper gate spacer 140, and upon the upper surface of gate cap 150.

Mask 160 may be formed by depositing one or more dielectric mask materials, or layers of material(s), by PVD, CVD, ALD, or the like. Mask 160 may be a hard mask layer. Exemplary gate mask 160 materials may be SiN, $SiO_2$, amorphous carbon, or the like. Utilizing known patterning, lithography, etching, etc. techniques, undesired portions of the gate mask may be removed, thereby forming opening 162 that exposes a portion of the ILD (e.g., a portion of the top surface of dielectric 104), while desired portions of mask 160 may be retained. The mask opening 162 may define a boundary or perimeter of an underlying S/D contact.

A sidewall of opening 162 may be coplanar with an outer sidewall of gate spacer 106 associated with replacement gate 115, with an outer sidewall of upper gate spacer 140 associated with replacement gate 115, may be coplanar with an opposing inner sidewall of this upper gate spacer 140, may be between the outer sidewall of this upper gate spacer 140 and the opposing inner facing sidewall of this upper gate spacer 140, or may be between a central bisector of gate cap 150 associated with replacement gate structure 115 and the outer facing sidewall this gate cap 150, or the like An opposing and facing sidewall of opening 162 may be coplanar with an outer facing sidewall of gate spacer 106 of replacement gate structure 113, may be between the outer facing sidewall of this gate spacer 106 and the opposing inner facing sidewall of this gate spacer 106, may be coplanar with an outer facing sidewall of mask 112 associated with replacement gate structure 113, or may be between a central bisector of mask 112 associated with replacement gate structure 113 and the opposing inner facing sidewall of gate spacer 106, or the like.

Figure 14:
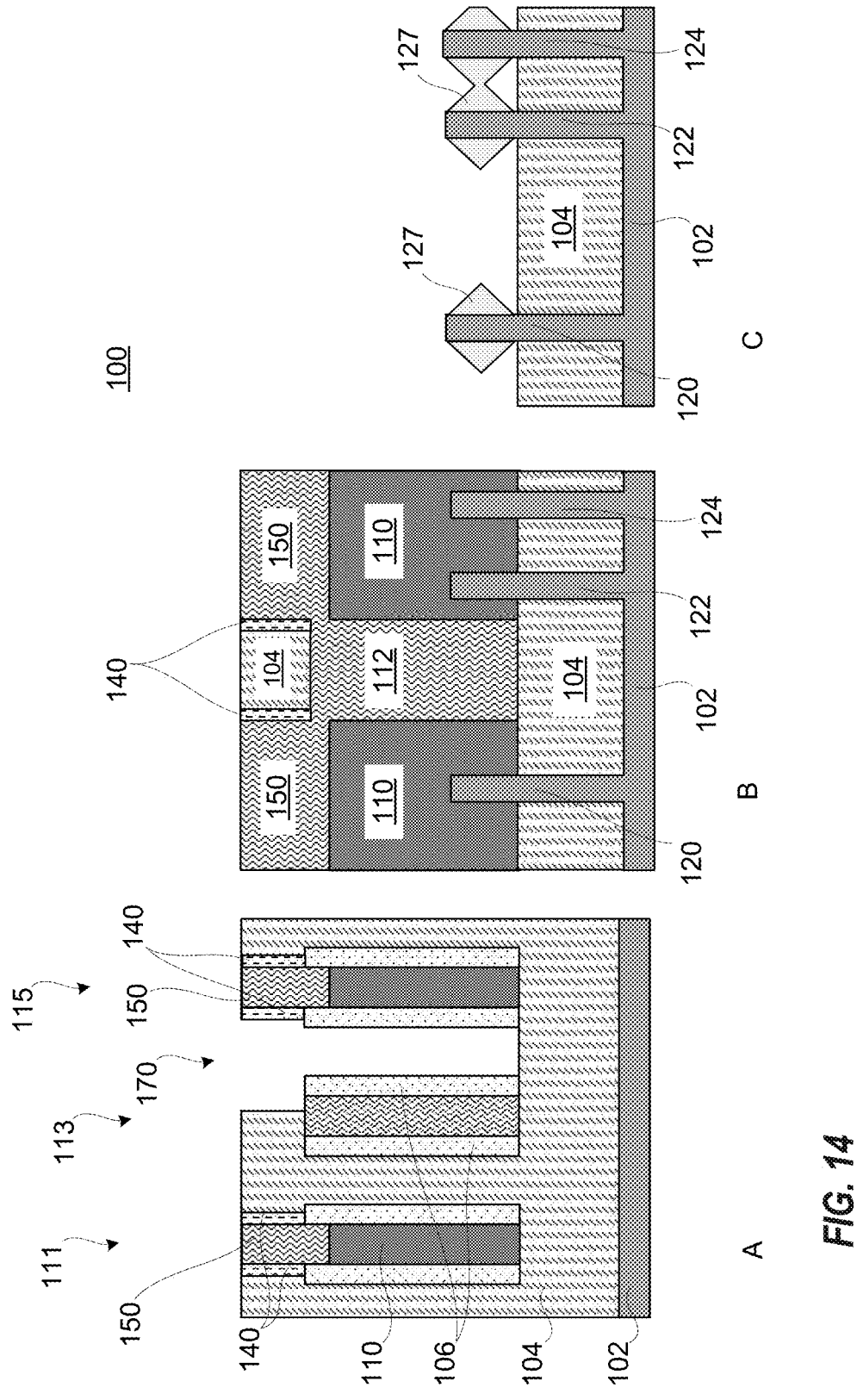

FIG. 14 depicts cross-sectional views of a semiconductor device 100 shown after a fabrication operation, in accordance with one or more embodiments. The current fabrication operation may include forming S/D opening 170 within the ILD between replacement gate structure 113 and replacement gate structure 115. The S/D opening 170 may remove sufficient ILD material (e.g., dielectric 104) above the ILD top surface (e.g., top surface of STI region, or the like) as depicted in cross-section C and expose at least a portion of S/D region(s) 127 and/or a portion of fins 120, 122, and/or 124.

Utilizing known etching, etc. techniques, undesired portions of the ILD material may be removed between replacement gate structure 113 and replacement gate structure 115, thereby forming S/D opening 170. The etchant may be selective to the mask 112, to the gate spacer 106, to upper gate spacer 140, and/or to gate cap 150 and may only remove e.g., dielectric material above the STI region (e.g., remove dielectric 104 that is above the top surface of dielectric 104 as shown in the C cross-section). The S/D opening 170 may further expose at least the outer facing sidewall of gate spacer 106 associated with replacement gate structure 113 and the outer facing sidewall of gate spacer 106 associated with replacement gate structure 115.

The boundary of S/D opening 170 above the replacement gate structure 113 and replacement gate structure 115 may be defined by the boundary of opening 162 used to pattern the boundary of S/D opening 170.

Figure 15:
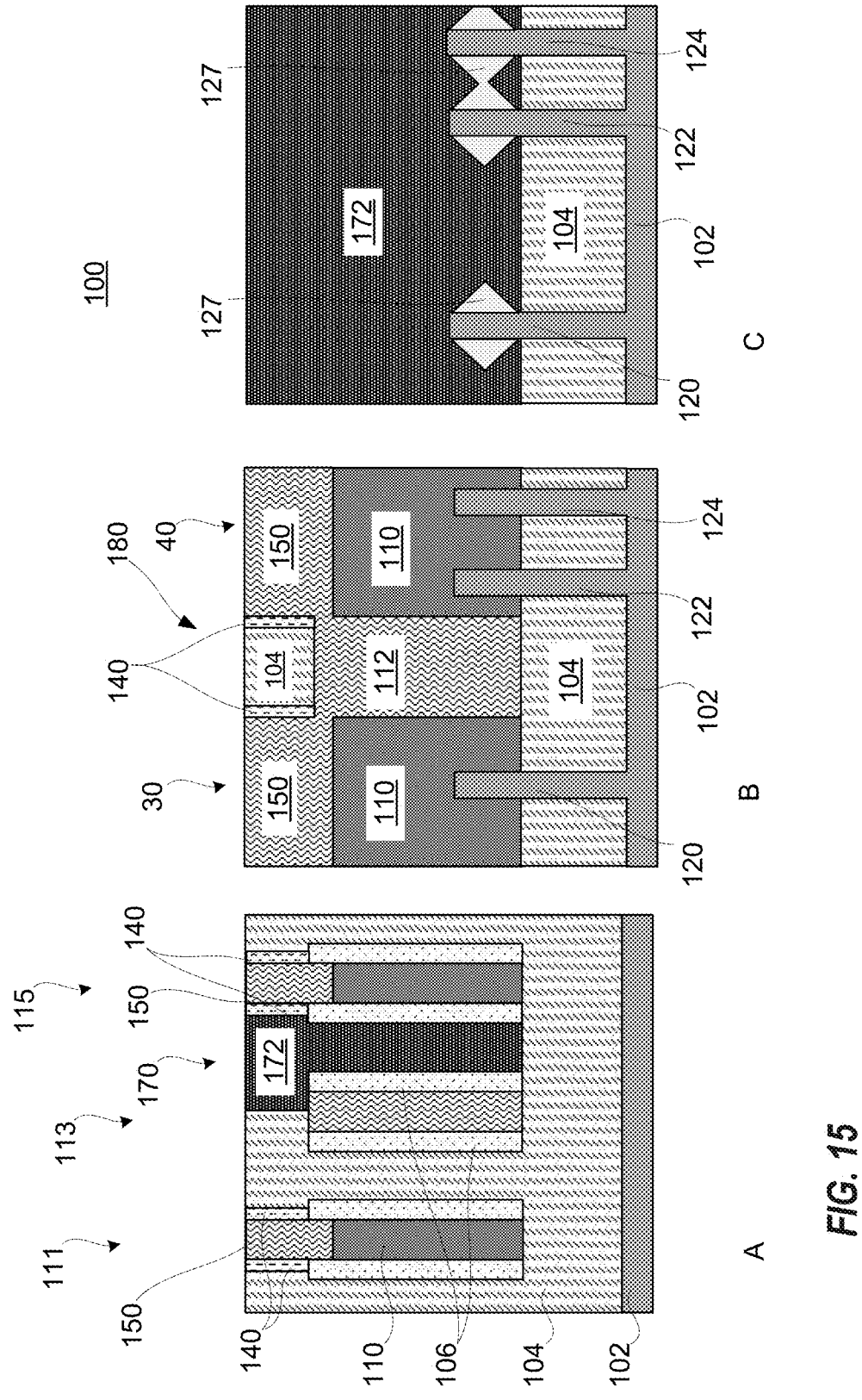

FIG. 15 depicts cross-sectional views of a semiconductor device 100 shown after a fabrication operation, in accordance with one or more embodiments. The current fabrication operation may include forming S/D contact 172 within the S/D opening 170.

S/D contact 172 may be formed by depositing a conductive material within S/D contact opening 170. Exemplary S/D contact 172 materials may include a silicide liner, such as Ti, Ni, NiPt, etc., followed by adhesion metal liner, such as TiN, TaN, TiC, etc., followed by conductive low resistance metal fill, such as W, Co, Ru, Cu, etc. After metal deposition, a contact metal CMP process can be used to remove excessive contact metals that are deposited above the ILD (e.g. top surface of dielectric 104 as shown in the A cross-section) above the upper gate spacer 140, and/or above the gate cap 150.

A sidewall of S/D contact 172 may be coplanar with an outer facing sidewall of gate spacer 106 of replacement gate structure 113. Another sidewall of S/D contact 172 may be coplanar with an outer facing sidewall of gate spacer 106 of replacement gate structure 115. A lower surface of a top portion of S/D contact 172 may be coplanar with a top surface of gate spacer 106 associated with replacement gate structure(s) 113, 115. A sidewall of the upper portion of S/D contact may be coplanar with upper gate spacer 140 of replacement gate structure 115 and may be coplanar with a sidewall of ILD (e.g., dielectric 104) generally above the replacement gate structure 113.

For clarity, as depicted in the B cross-section, semiconductor device 100 may include a residual gate cut region 20 multilayer structure 180. The multilayer structure 180 may include a substantially vertical pair of upper gate spacers 140 with dielectric 104 therebetween. The multilayer structure 180 is generally within gate cut region 20 that separates the first gate 30 from the second gate 40 of the same inline replacement gate structure and may be generally located above first gate 30 and second gate 40.

For further clarity, the bottom surfaces of multilayer structure 180 may be coplanar with one or more bottom surface(s) of another upper gate spacer 140 associated with a different replacement gate structure 111 and/or replacement gate structure 115. The bottom surfaces of multilayer structure 180 may be coplanar with one or more upper surface(s) of a lower gate spacer (e.g., gate spacer 106) associated with the different replacement gate structure 111 and/or replacement gate structure 115.

For further clarity, a left outer sidewall of multilayer structure 180 may be coplanar with an end sidewall of first gate 30 and/or an end sidewall of gate cap 150 that is upon the first gate 30. A right outer sidewall of multilayer structure 180 may be coplanar with an end sidewall of second gate 40 and/or an end sidewall of gate cap 150 that is upon the second gate 40.

For further clarity, the thickness(es) or horizontal dimension of the upper gate spacer 140 within the multilayer structure 180 may be the same thickness of the other upper gate spacer(s) 140 associated with other replacement gate structures 111, 115. The bottom surface of the multilayer structure 180 may be coplanar with mask 112 there below and may be above the top surface of the first gate 30 and the second gate 40.

For further clarity, a matching, similar, same, material layer otherwise vertically in line with the respective spacer 140 of the multilayer structure 180 (i.e., upon an end surface of first gate 30 or an end surface of second gate 40) may be absent or otherwise not formed upon the end surface of first gate 30 and/or the end surface of second gate 40.

Figure 16:
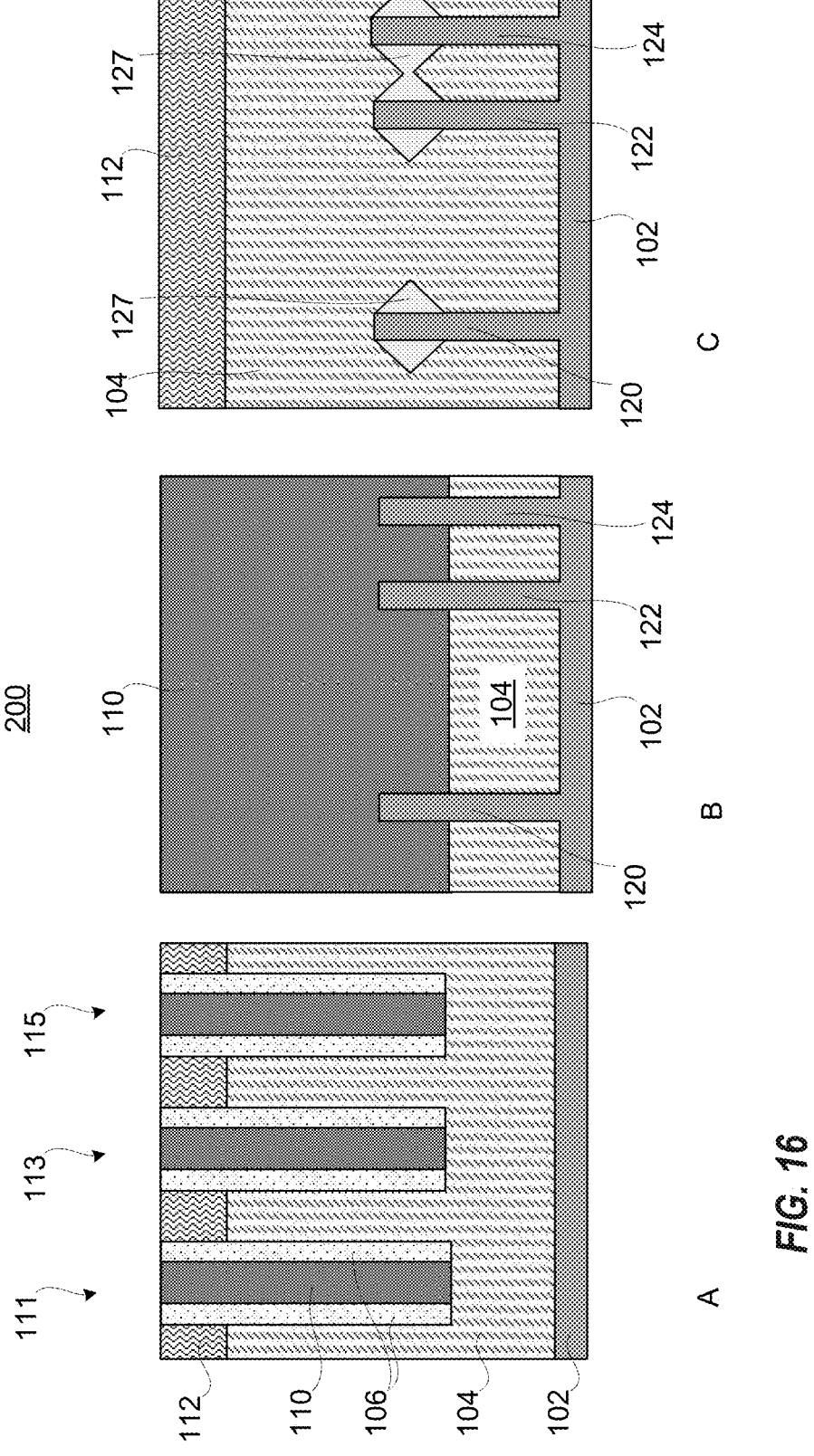
FIG. 16 through FIG. 24 depicts cross-sectional views of a semiconductor device shown after one or more fabrication operations, in accordance with one or more embodiments.

FIG. 16 depicts cross-sectional views of a semiconductor device 200 shown after initial fabrication operations, in accordance with one or more embodiments. After the initial fabrication operations, semiconductor device 200 may include a substrate 102, dielectric 104, mask 112, replacement gate structures 111, 113, 115, and fins 120, 122, 124. Each replacement gate structure 111, 113, 115 may include a gate spacer 106 and a replacement gate 110. The substrate 102, dielectric 104, mask 112, replacement gate structures 111, 113, 115, and fins 120, 122, 124 may be fabricated similarly to those features described with respect to semiconductor 100 and relevant descriptions associated therewith are therefore not repeated.

Figure 17:
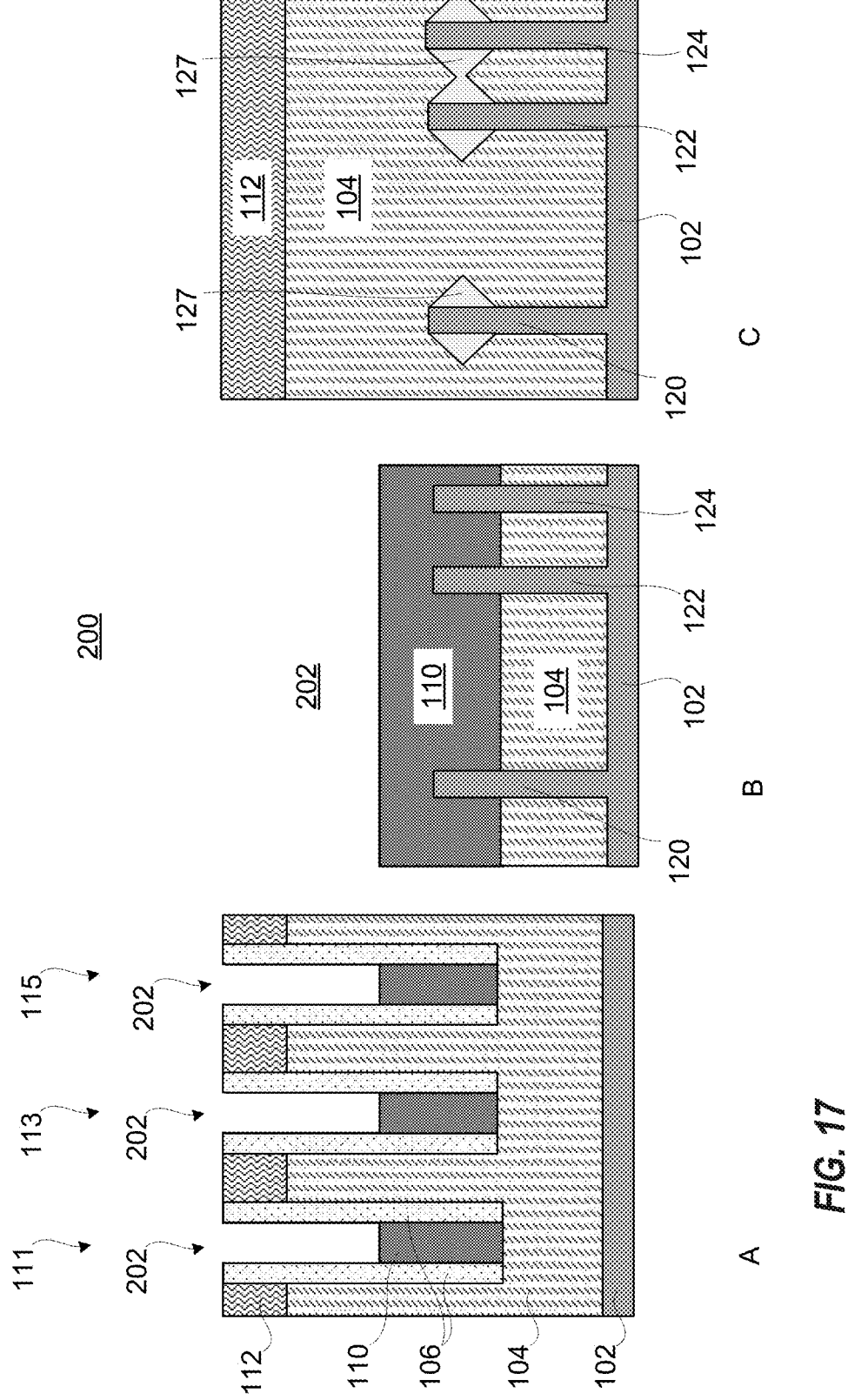

FIG. 17 depicts cross-sectional views of a semiconductor device 100 shown after a fabrication operation, in accordance with one or more embodiments. The current fabrication operation may include forming upper gate openings 202 by recessing the replacement gate 110 that is associated with replacement gate structure 111, 113, and/or 115.

Utilizing known removal techniques, an upper portion of the exposed replacement gate(s) 110 may be removed, thereby forming upper gate opening 202, while a desired lower portion of replacement gate 110 may be retained. For example, a predetermined timed exposure to an etchant with selectivity to the material(s) of mask 112 and gate spacer 106 may remove the undesired upper portion of replacement gate(s) 110, while leaving the material(s) of mask 112 and gate spacer 106 largely, adequately, or suitably intact. Exposure of semiconductor device 200 to the etchant may end after a predetermined time threshold, thereby leaving or retaining the desired lower portion(s) of replacement gate(s) 110. Upper gate opening 202 may expose at least an upper portion(s), only an upper portion(s), or the like, of inner facing sidewall(s) of spacer 106.

In an embodiment, as depicted, upper gate opening 202 is formed to a depth such that a lower well surface of upper gate opening 202 is below an upper surface of the ILD (e.g., upper surface of dielectric 104), is below a lower surface of mask 112 as shown in the A cross-section, or the like. Further, upper gate opening 202 is formed to a depth such that an upper surface of replacement gate(s) 110 is above an upper surface of fins 120, 122, 124.

Figure 18:
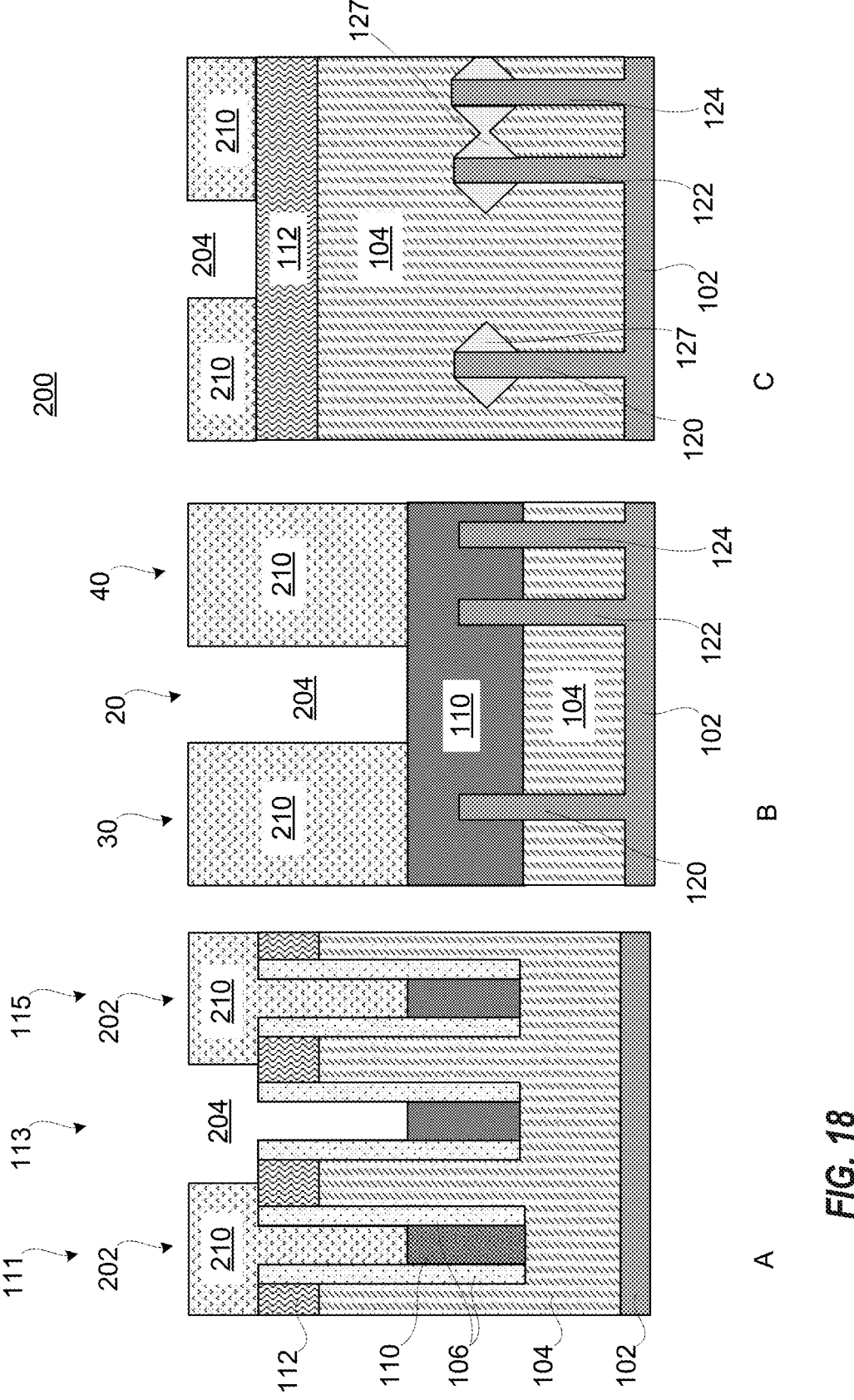

FIG. 18 depicts cross-sectional views of a semiconductor device 200 shown after a fabrication operation, in accordance with one or more embodiments. The current fabrication operation may include forming mask 210 and patterning mask 210 to form opening 204 therein.

The mask 210 can be formed by any suitable process or any suitable combination of multiple processes, including but not limited to, ALD, CVD, PVD, spin-coating or the like. The mask 210 may be formed upon mask 112, upon upper surface(s) of gate spacer(s) 106, upon sidewall surface(s) of gate spacer(s) 106 within opening 204, and/or upon replacement gates 110 associated with replacement gate structures 111, 113, and/or 115.

The mask 210 may be patterned by removing undesired portions thereof while retaining desired portions thereof. The portions of patterned mask 210 may effectively protect underlying regions of the semiconductor device 200 while the opening 204 may expose or otherwise define the underlying gate cut region 20 of semiconductor device 200. The mask 210 may be patterned by known lithography, etching, or other material removal techniques. The opening 204 within mask 210 may expose at least a portion of the upper surface of replacement gate 110 associated with replacement gate structure 113. Alternatively, as depicted, opening 204 exposes the upper surface of replacement gate structure 113, upper surface and upper sidewall(s) of gate spacer 106 of replacement gate structure 113, and/or a portion of the upper surface of mask 112 that surrounds the perimeter of replacement gate structure 113.

Figure 19:
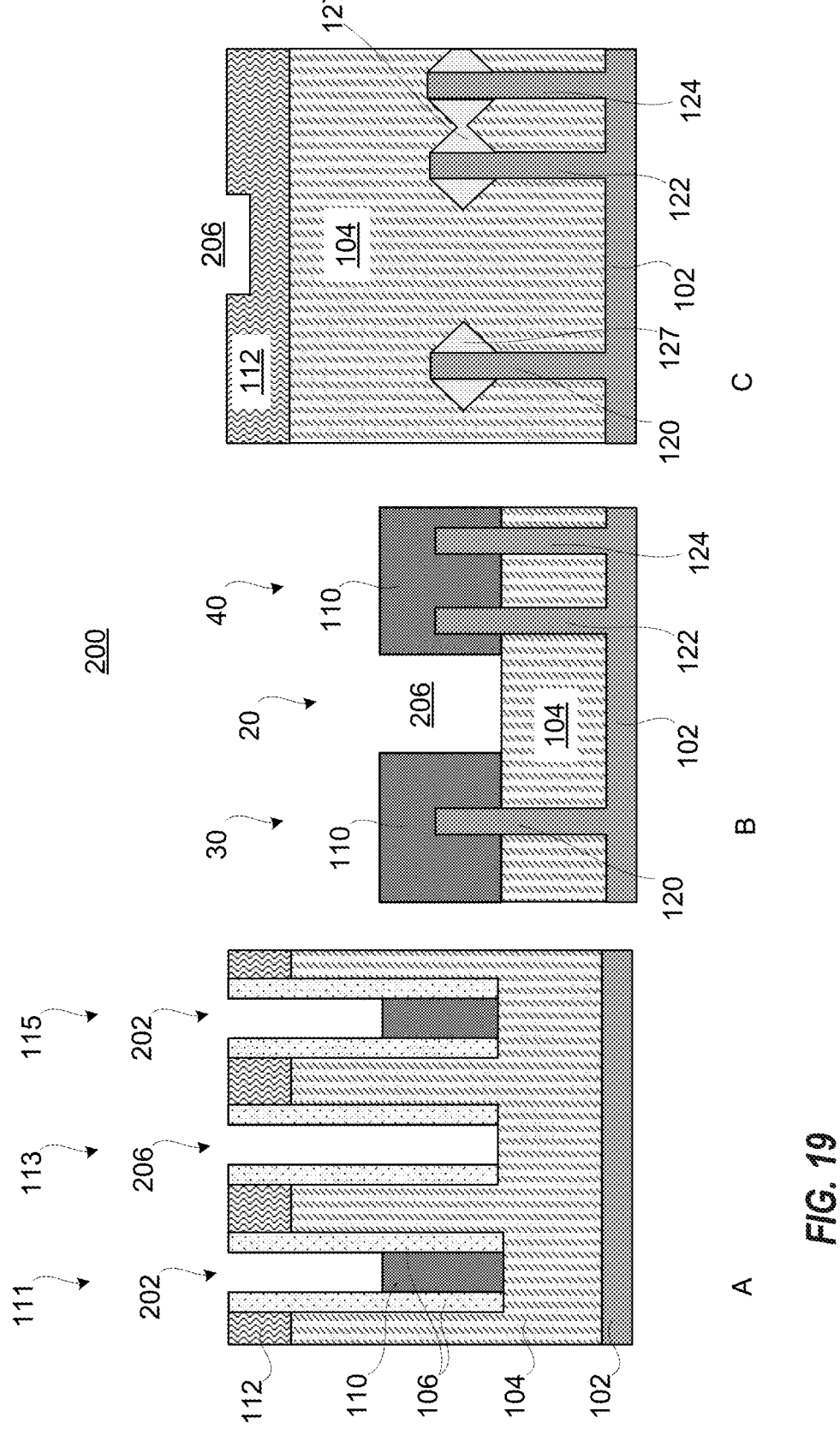

FIG. 19 depicts cross-sectional views of a semiconductor device 200 shown after a fabrication operation, in accordance with one or more embodiments. The current fabrication operations may reform upper gate opening 202 by removing mask 210 and may form gate cut opening 206 that effectively physically separates replacement gate structure 113 into first gate 30 and second gate 40. The perimeter of gate cut opening 206 may substantially correspond with the perimeter of opening 204 and may, therefore, define gate cut region 20.

Utilizing known removal techniques, the exposed replacement gate 110 associated with replacement gate structure 113 may be removed, thereby forming gate cut opening 206, while desired portions of replacement gate 110 associated with replacement gate structure 113 may be retained, thereby forming first gate 30 and second gate 40. For example, a etchant with selectivity to the material(s) of mask 210 and gate spacer 106 may remove the exposed replacement gate 110, associated with replacement gate structure 113, while leaving the material(s) of mask 112 and gate spacer 106 largely, adequately, or suitably intact.

Gate cut opening 206 may expose respective ends of first gate 30 and second gate 40, may expose the inner facing sidewall(s) of spacer 106 associated with replacement gate structure 113, and may expose a lower well surface of dielectric 104 (e.g., an upper surface of the STI region). As such, gate cut opening 206 may fully physically separate the first gate 30 from the second gate 40.

Figure 20:
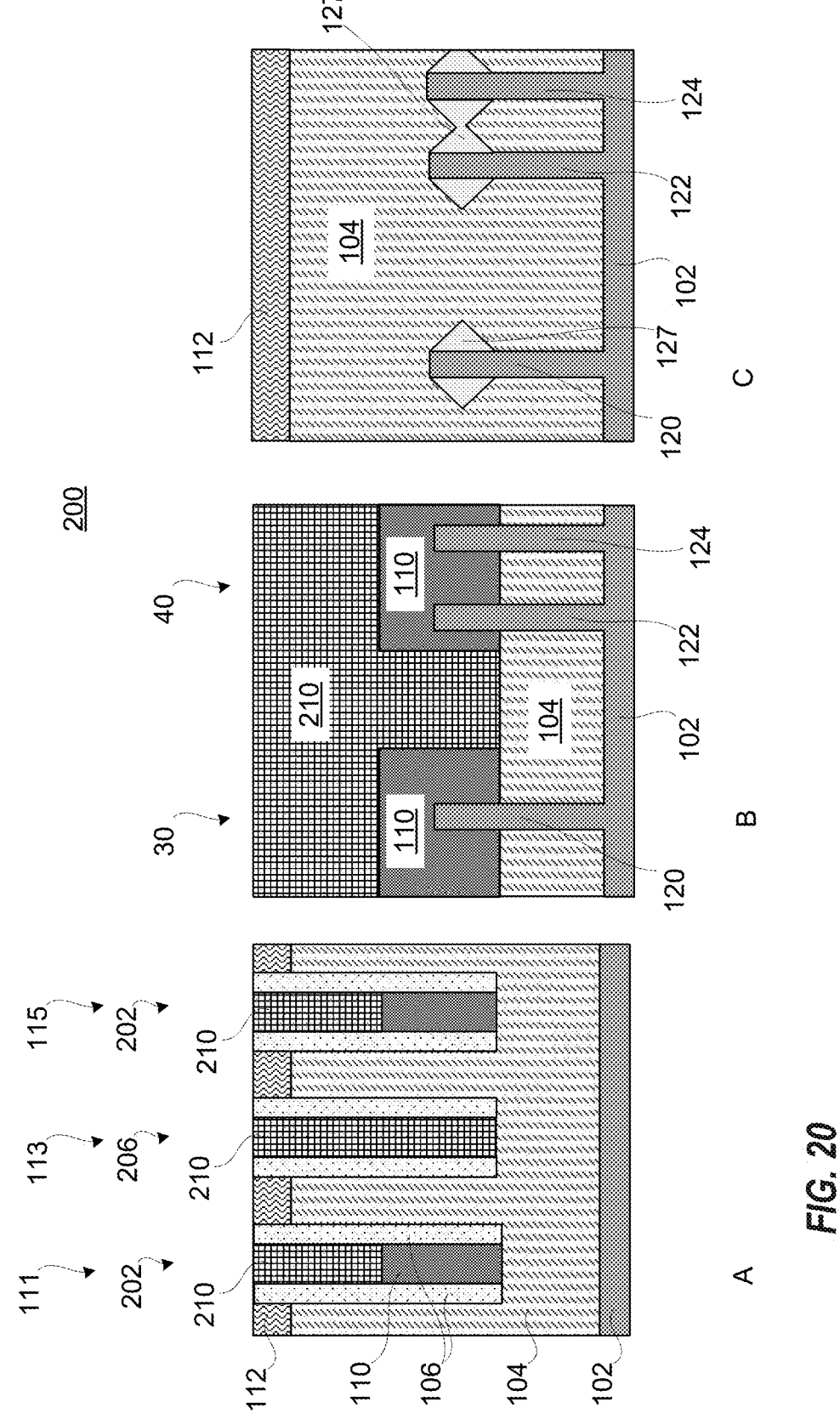

FIG. 20 depicts cross-sectional views of a semiconductor device 100 shown after a fabrication operation, in accordance with one or more embodiments. The current fabrication operation may include forming a sacrificial gate cap 210 within upper gate opening 202 and within gate cut opening 206. For example, sacrificial gate cap 138 is formed in the respective upper gate opening 202 that is associated with replacement gate structures 111, 115. Further, sacrificial gate cap 138 may be formed in the gate cut opening 206 that is associated with replacement gate structure 113.

Sacrificial gate cap 210 may be formed within upper gate opening 202 and gate cut opening 206 by CVD, ALD, or the like. The sacrificial gate cap 210 may be a sacrificial material, such as amorphous Si, or the like. Subsequent to forming sacrificial gate cap 210, the top surface mask 112, the top surface of the replacement gate structures 111, 113, and 115, the top surface of gate spacer(s) 106, the top surface of sacrificial gate cap 210 may be planarized by a CMP, or the like.

Figure 21:
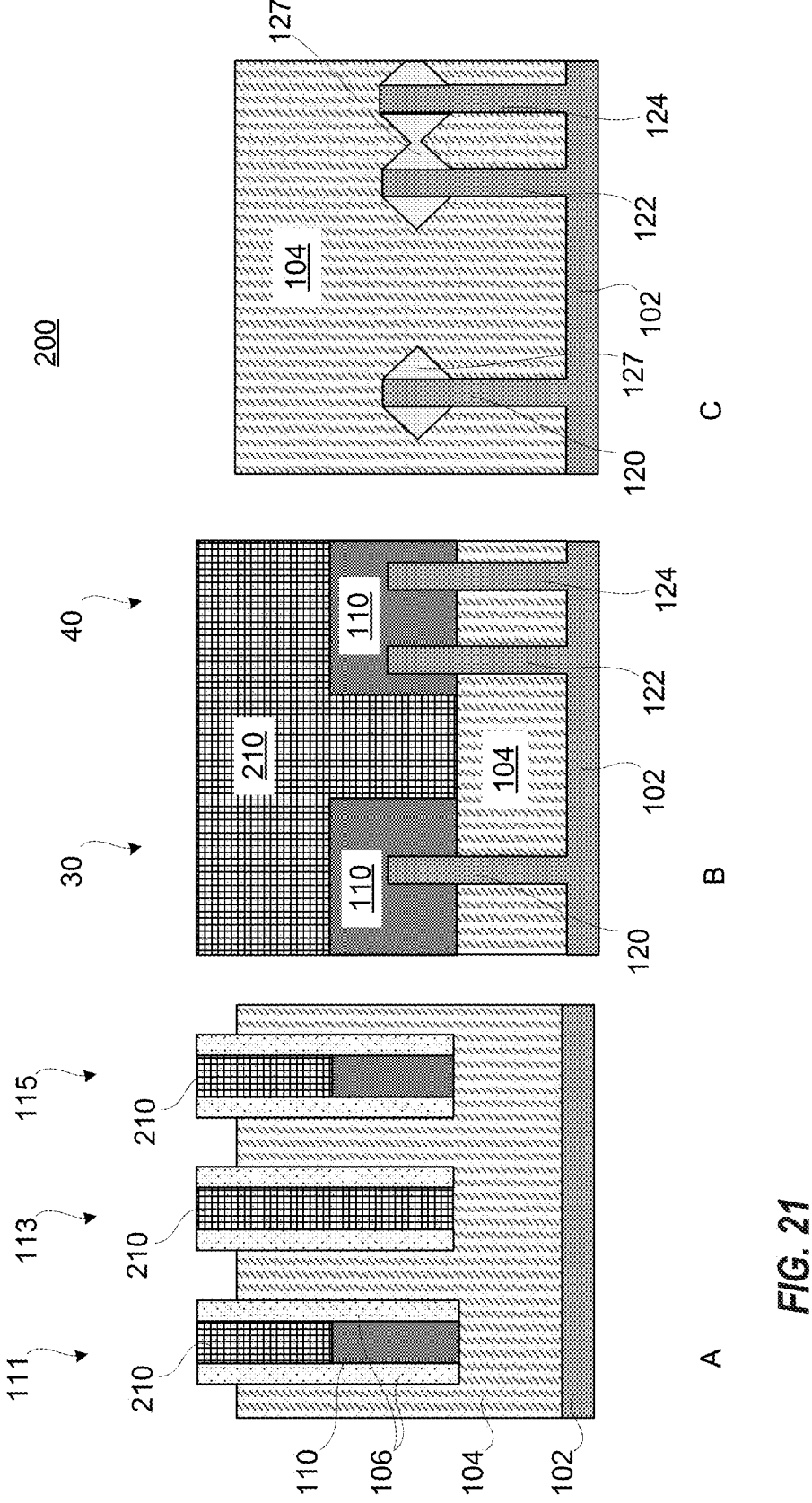

FIG. 21 depicts cross-sectional views of a semiconductor device 200 shown after a fabrication operation, in accordance with one or more embodiments. The current fabrication operation may include removing mask 112 that is above the upper surface of the ILD (e.g., upper surface of dielectric 104).

Utilizing known removal techniques, the mask 112 that is above the upper surface of the ILD may be removed. For example, an wet or dry etch that removes mask 112 may be utilized with the dielectric 104 as an etch stop to remove the mask 112 above the upper surface of the ILD.

Figure 22:
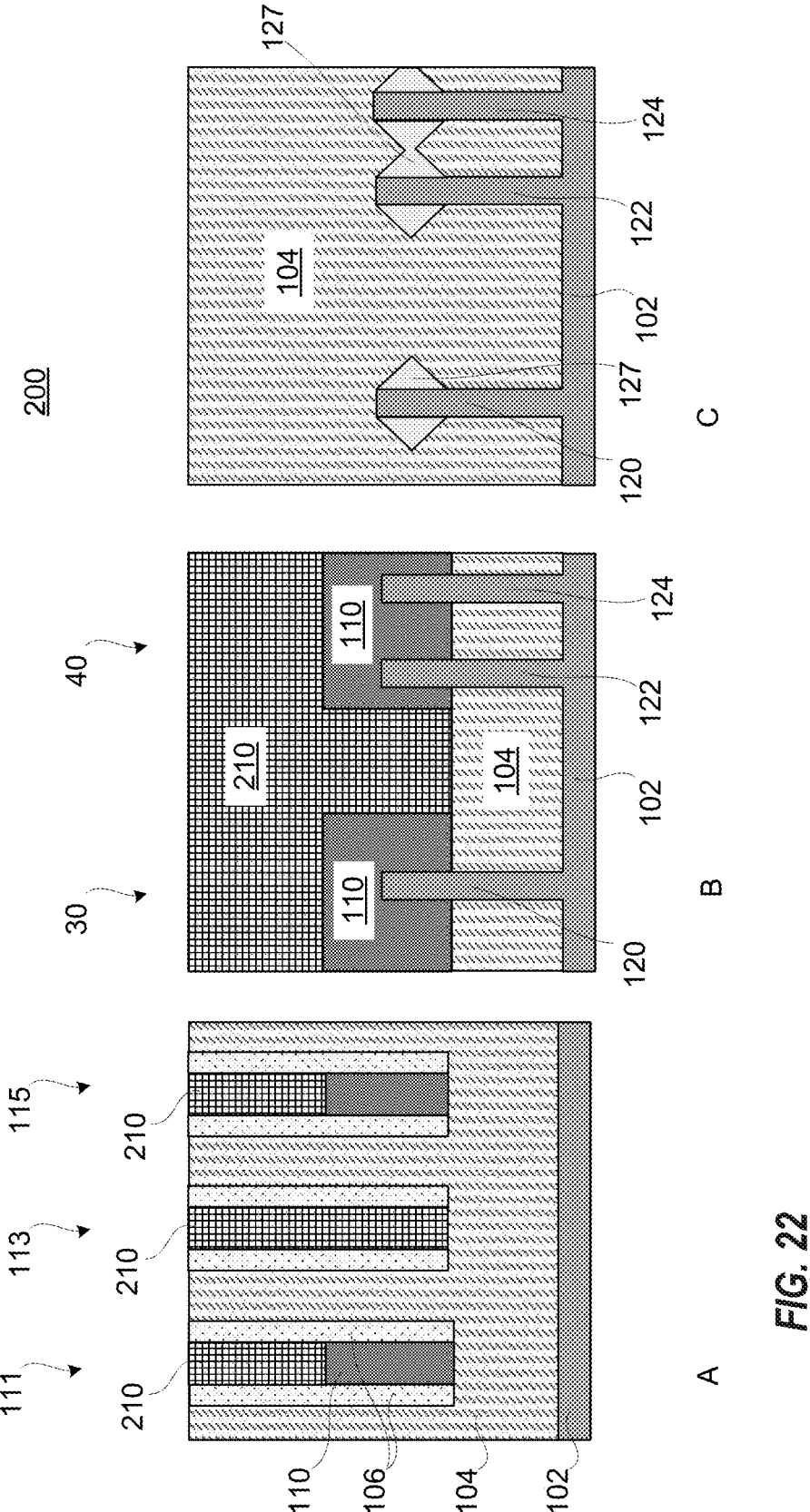

FIG. 22 depicts cross-sectional views of a semiconductor device 100 shown after a fabrication operation, in accordance with one or more embodiments. The current fabrication operation may include forming an ILD upon dielectric 104, upon gate spacer 106, and/or upon sacrificial gate cap 210.

The ILD (e.g., depicted portion of dielectric 104 above dielectric 104 as shown in FIG.21) may be formed by CVD, ALD. The top surface of the ILD may be recessed or planarized with the top surface of gate spacer 106 and/or the top surface of sacrificial gate cap 210. Exemplary ILD materials may be SiN, $SiO_2$, a combination of SiN and $SiO_2$, or the like. The top surface of the ILD, the top surface of the gate spacer 106, and/or the top surface of sacrificial gate cap 210 may be planarized by a CMP. In the depicted embodiment, the formed ILD may be the same material as dielectric 104.

Figure 23:
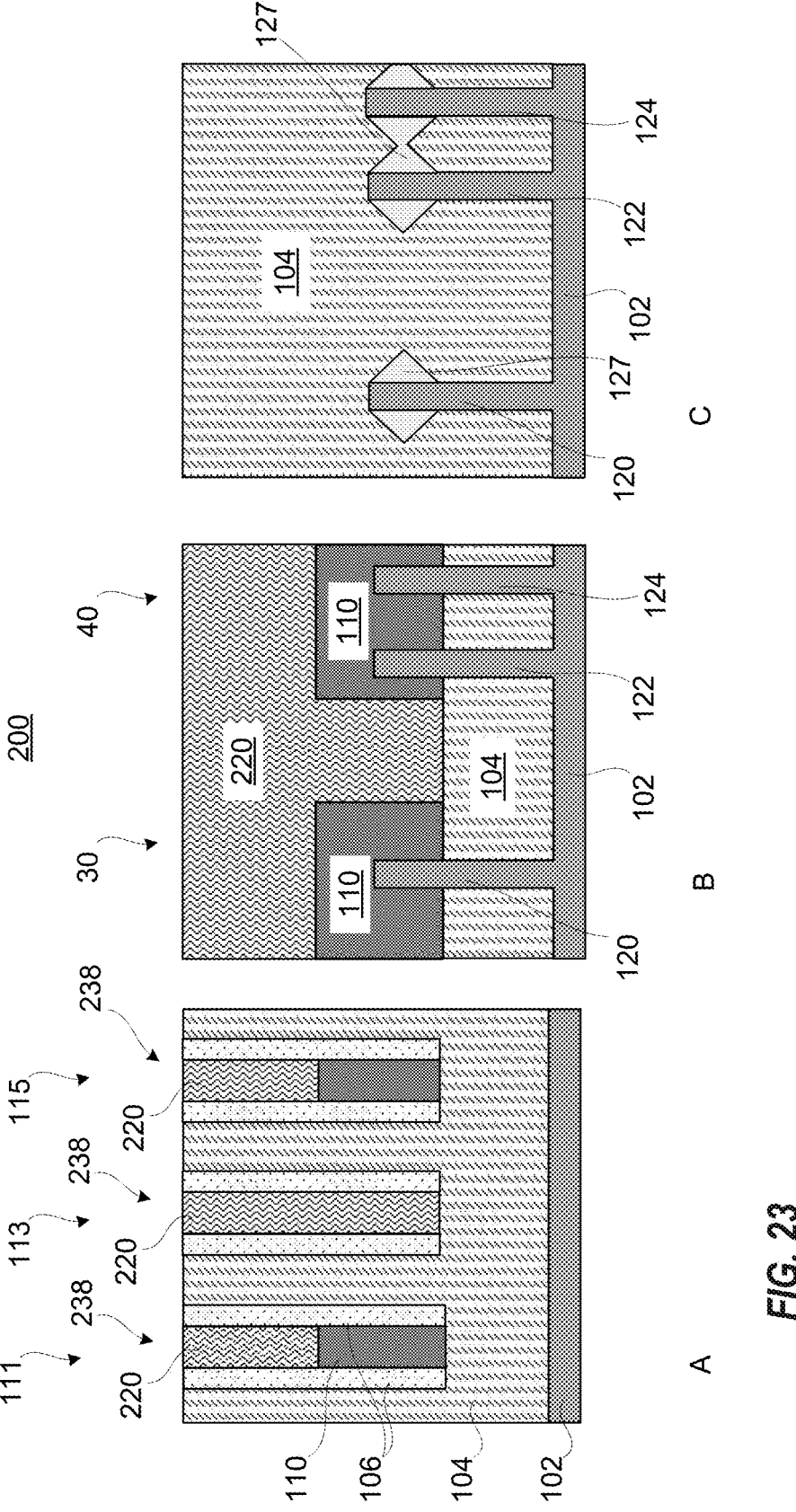

FIG. 23 depicts cross-sectional views of a semiconductor device 100 shown after a fabrication operation, in accordance with one or more embodiments. The current fabrication operation may include forming an upper gate opening 238 by removing sacrificial gate cap 210.

Utilizing known removal techniques, sacrificial gate cap 210 may be removed to expose the upper surface of the lower portion of replacement gate 110 associated with replacement gate structures 111 and 115 and/or to expose a portion of the upper surface of the STI region (e.g., top surface of dielectric 104 as shown in the B cross-section) associated with replacement gate structure 113.

For example, a etchant with selectivity to the material(s) of dielectric 104, gate spacer 106, and replacement gate 110 may remove sacrificial gate cap 210 while leaving these materials adequately, fully, substantially intact. Upper gate opening 238 may expose at least an upper portion(s), only an upper portion(s), or the like, of inner facing sidewall(s) of spacer 106 (e.g., associated with replacement gate structures 111, 115) and may expose the inner facing sidewall(s) of spacer 106 (e.g., associated with replacement gate structure 113, as depicted in the B cross-section).

The current fabrication operation may include forming a gate cap 220 within upper gate opening 238. For example, gate cap 220 is formed in the respective upper gate opening 238 that is associated with replacement gate structures 111, 113, and/or 115.

Gate cap 220 may be formed within upper gate opening 238 by CVD, ALD, or the like. The gate cap 220 may be a dielectric material, such as SiN, $SiO_2$, a combination of SiN and $SiO_2$, or the like. In the depicted embodiment, the gate cap 220 material may be the same material as mask 112. Subsequent to forming gate cap 220, the top surface of gate cap 220, the top surface of the replacement gate structures 111, 113, and 115, the top surface of gate spacer 106 may be planarized by a CMP, or the like. In an embodiment, as depicted, gate cap 220 has a bottom surface that is below an upper surface of gate spacer 106.

Figure 24:
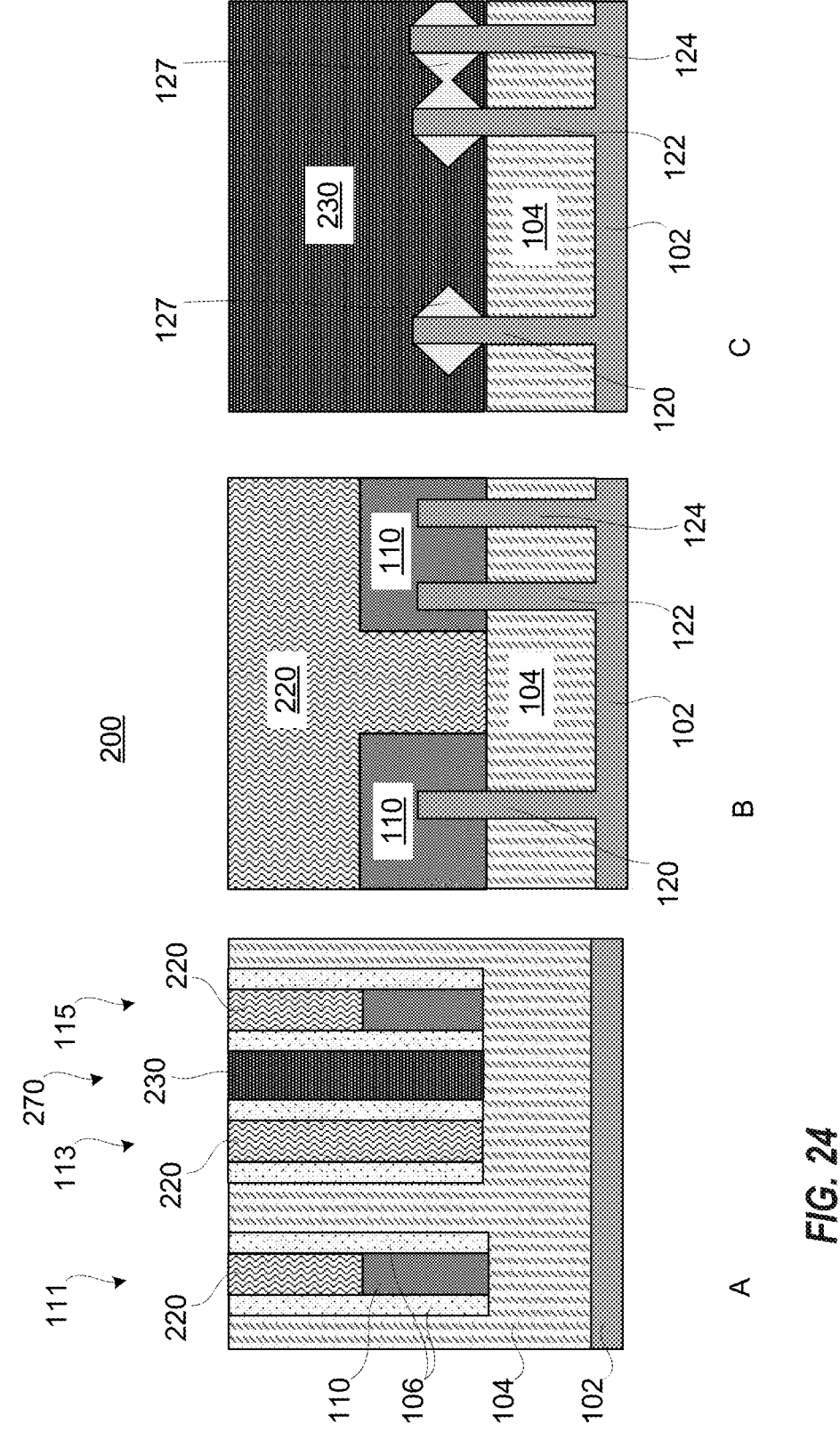

FIG. 24 depicts cross-sectional views of a semiconductor device 100 shown after a fabrication operation, in accordance with one or more embodiments. The current fabrication operation may include forming S/D opening 270 within the ILD between replacement gate structure 113 and replacement gate structure 115. The S/D opening 270 may remove sufficient ILD material (e.g., dielectric 104) above the ILD top surface (e.g., top surface of STI region, or the like) as depicted in cross-section C and expose at least a portion of S/D region(s) 127 and/or a portion of fins 120, 122, and/or 124.

Utilizing known etching, etc. techniques, undesired portions of the ILD material may be removed between replacement gate structure 113 and replacement gate structure 115, thereby forming S/D opening 270. The etchant may be selective to gate cap 220 and to gate spacer 106 and may only remove e.g., dielectric material above the STI region (e.g., remove dielectric 104 that is above the top surface of dielectric 104 as shown in the C cross-section). The S/D opening 270 may further expose at least the outer facing sidewall of gate spacer 106 associated with replacement gate structure 113 and the outer facing sidewall of gate spacer 106 associated with replacement gate structure 115.

The current fabrication operation may include forming S/D contact 230 within the S/D opening 270.

S/D contact 230 may be formed by depositing a conductive material within S/D contact opening 270. Exemplary S/D contact 230 materials may include a silicide liner, such as Ti, Ni, NiPt, etc., followed by adhesion metal liner, such as TiN, TaN, TiC, etc., followed by conductive low resistance metal fill, such as W, Co, Ru, Cu, etc. After metal deposition, a contact metal CMP process can be used to remove excessive contact metals that are deposited above the ILD (e.g. top surface of dielectric 104 as shown in the A cross-section) and/or above the gate cap 150.

A sidewall of S/D contact 230 may be coplanar with an outer facing sidewall of gate spacer 106 of replacement gate structure 113. Another sidewall of S/D contact 230 may be coplanar with an outer facing sidewall of gate spacer 106 of replacement gate structure 115.

FIG. 25 depicts a flow diagram illustrating a method 300 of fabricating the semiconductor device 100, according to one or more embodiments of the present invention. Method 300 may begin at block 302 and continues with forming a first replacement gate and a second replacement gate. For example, replacement gate 113 is formed between gate spacer 106, upon and around one or more fins 120, 122, and/or 124, and upon the STI region of the semiconductor substrate. Similarly, replacement gate 115 may be formed between another gate spacer 106, upon and around one or more fins 120, 122, and/or 124, and upon the STI region of the semiconductor substrate.

Method 300 may continue with forming a gate cut opening that separates the first replacement gate into a first gate and a second gate (block 306). For example, replacement gate 110 of the replacement gate structure 113 is split into a physically and/or electrically distinct first gate 30 and second gate 40 by gate cut opening 134. The gate cut opening 134 may expose the respective ends of the first gate 30 and the second gate 40 and may expose a portion of the top surface of the STI region of the semiconductor substrate.

Method 300 may continue with forming a dielectric material within the gate cut opening. For example, mask 112 material may be formed within the gate cut opening 134. Method 300 may continue with forming upper gate openings by recessing the second replacement gate, by recessing the first gate, and by recessing the second gate. For example, upper gate opening 136 may be formed by recessing the replacement gate 110 associated with replacement gate structure 115, another upper gate opening 136 may be formed by recessing the replacement gate 110 associated with the first gate 30, and yet another upper gate opening 136 may be formed by recessing the replacement gate 110 associated with gate 40.

Method 300 may continue with forming a sacrificial gate cap within each upper gate opening (block 312). For example, sacrificial gate cap 138 may be formed within the first upper gate opening 136 associated with replacement gate structure 115, another sacrificial gate cap 138 may be formed within the upper gate opening 136 associated with the first gate 30, and yet another sacrificial gate cap 138 may be formed within the upper gate opening 136 associated with gate 40.

Method 300 may continue with exposing at least a portion of the sacrificial gate caps (block 314). For example, material above the ILD (e.g., mask 112 material, gate spacer 106 material, etc.) may be removed. Such removal may reform or otherwise form an upper gate cut opening 139, as shown in FIG. 8, above the dielectric (e.g., mask 112) within the gate cut opening and between the sacrificial gate caps 138 associated with the first gate 30 and the second gate 40.

Method 300 may continue with forming an upper gate spacer around the exposed sacrificial gate cap 138. For example, upper gate spacer 140 may be formed around the exposed sacrificial gate cap 138, upon the gate spacer 106, etc. that are associated with the replacement gate structure 115. Similarly, upper gate spacer 140 may be formed upon at least an end surface of the exposed sacrificial gate cap 138, upon the mask 112, etc. that are associated with the first gate 30 and/or the second gate 40, respectively.

Method 300 may continue with forming an ILD between the upper gate spacer(s) within the gate cut opening (block 318). For example, dielectric 104 material may be formed within the remaining upper gate cut opening 139 upon mask 112 and upon the upper gate spacer(s) 140.

Method 300 may continue with removing the sacrificial gate caps and forming replacement gate caps in place thereof (block 320). For example, upper gate opening 142 may be formed by removing the sacrificial gate cap 138 associated with replacement gate structure 115, another upper gate opening 142 may be formed by removing the sacrificial gate cap 138 associated with first gate 30, and yet another upper gate opening 142 may be formed by removing the sacrificial gate cap 138 associated with second gate 40. Replacement gate cap 150 may be formed in the upper gate opening 142 associated with replacement gate structure 115, another replacement gate cap 150 may be formed within the upper gate opening 142 associated with first gate 30, and yet another replacement gate cap 150 may be formed within the upper gate opening 142 associated with second gate 40.

Method 300 may continue with forming a S/D opening between the first replacement gate and the second replacement gate (block 324). For example, S/D opening 170 may be formed between replacement gate structure 113 and replacement gate structure 115. The S/D opening 170 may expose, partially expose, or the like, fins 120, 122, and/or 124. Similarly, the S/D opening 170 may expose, partially expose, or the like, S/D regions 127.

Method 300 may continue with forming a S/D contact withing the S/D contact opening. For example, a conductive S/D contact 172 may be formed within the S/D contact opening 170 and may physically and/or electrically contact the at least partially exposed fins 120, 122, 124, and/or S/D region(s) 127. Method 300 may end at block 328.

FIG. 26 depicts a flow diagram illustrating a method 400 of fabricating the semiconductor device 200, according to one or more embodiments of the present invention. Method 400 may begin at block 402 and continues with forming a first replacement gate and a second replacement gate. For example, replacement gate 113 is formed between gate spacer 106, upon and around one or more fins 120, 122, and/or 124, and upon the STI region of the semiconductor substrate. Similarly, replacement gate 115 may be formed between another gate spacer 106, upon and around one or more fins 120, 122, and/or 124, and upon the STI region of the semiconductor substrate.

Method 400 may continue with forming upper gate openings above the first replacement gate and the second replacement gate. For example, upper gate opening 202 is formed above the replacement gate 110 of replacement gate structure 113 and another upper gate opening 202 is formed above the replacement gate 110 of replacement gate structure 115.

Method 400 may continue with forming a gate cut opening that separates the first replacement gate into a first gate and a second gate (block 408). For example, replacement gate 110 of the replacement gate structure 113 is split into a physically and/or electrically distinct first gate 30 and second gate 40 by gate cut opening 206. The gate cut opening 206 may expose the respective ends of the first gate 30 and the second gate 40 and may expose a portion of the top surface of the STI region of the semiconductor substrate.

Method 400 may continue with forming a sacrificial gate cap within the gate cut opening and within the upper gate openings (block 410). For example, sacrificial gate cap 210 may be formed within the gate cut opening 206, another sacrificial gate cap 210 may be formed upon the replacement gate 110 of first gate 30 within the associated upper gate opening 202, another sacrificial gate cap 210 may be formed upon the replacement gate 110 of second gate 40 within the associated upper gate opening 202, and/or another sacrificial gate cap 210 may be formed upon the replacement gate 110 of replacement gate structure 115 within the associated upper gate opening 202.

Method 400 may continue with forming upper gate openings by recessing the second replacement gate, by recessing the first gate, and by recessing the second gate. For example, upper gate opening 136 may be formed by recessing the replacement gate 110 associated with replacement gate structure 115, another upper gate opening 136 may be formed by recessing the replacement gate 110 associated with the first gate 30, and yet another upper gate opening 136 may be formed by recessing the replacement gate 110 associated with gate 40.

Method 400 may continue with forming an ILD around the sacrificial gate structures and planarizing the ILD with the top surface(s) of the sacrificial gate caps. For example, dielectric 104 is formed upon an underlying dielectric 104 around the gate spacer(s) associated with the replacement gate structure 113 and around the gate spacer(s) 106 associated with the replacement gate structure 115. A CMP may planarize the ILD, the top surface of the spacer(s) 106, and the top surface of the sacrificial gate cap(s) 210.

Method 400 may continue with removing the sacrificial gate caps and forming replacement gate caps in place thereof (block 414). For example, upper gate opening 238 may be formed by removing the sacrificial gate cap 210 associated with replacement gate structure 115, another upper gate opening 238 may be formed by removing the sacrificial gate cap 210 associated with first gate 30, and yet another upper gate opening 238 may be formed by removing the sacrificial gate cap 210 associated with second gate 40. Replacement gate cap 220 may be formed in the upper gate opening 238 associated with replacement gate structure 115, another replacement gate cap 220 may be formed within the upper gate opening 238 associated with first gate 30, and yet another replacement gate cap 220 may be formed within the upper gate opening 238 associated with second gate 40.

Method 400 may continue with forming a S/D opening between the first replacement gate and the second replacement gate (block 416). For example, S/D opening 270 may be formed between replacement gate structure 113 and replacement gate structure 115. The S/D opening 270 may expose, partially expose, or the like, fins 120, 122, and/or 124. Similarly, the S/D opening 270 may expose, partially expose, or the like, S/D regions 127 associated with fins 120, 122, and/or 124.

Method 400 may continue with forming a S/D contact withing the S/D contact opening. For example, a conductive S/D contact 230 may be formed within the S/D contact opening 270 and may physically and/or electrically contact the at least partially exposed fins 120, 122, 124, and/or S/D region(s) 127. Method 400 may end at block 420.

The method flow diagrams depicted herein are exemplary. There can be many variations to the diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
a first gate structure upon a first dielectric material;
a gate cut region that separates the first gate structure into at least a first gate conductor and a second gate conductor;
a gate cut dielectric filling the gate cut region, wherein the gate cut dielectric is directly upon an end of the first gate conductor and directly upon an end of the second gate conductor, wherein the gate cut dielectric is a different material from the first dielectric material;
a first gate cap upon a top surface of at least the first gate conductor and a second gate cap upon at least a top surface of the second gate conductor; and
a gate cut multilayer structure directly upon a top surface of the gate cut dielectric and between the first gate cap and the second gate cap, the gate cut multilayer structure comprising an inner dielectric composed of the first dielectric material between a first high-k dielectric spacer and a second high-k dielectric spacer, wherein a first sidewall of the gate cut multilayer structure is coplanar with the end of the first gate conductor and a second opposing sidewall of the gate cut multilayer structure is coplanar with the end of the second gate conductor, and wherein respective top surfaces of the first gate cap, the second gate cap, and the gate cut multilayer structure are substantially coplanar.

2. The semiconductor device of claim 1, wherein a bottom surface of the gate cut multilayer structure is above the top surface of the first gate conductor and is above the top surface of the second gate conductor.

3. The semiconductor device of claim 1, wherein the first sidewall of the gate cut multilayer structure is coplanar with an end of the first gate cap and the second opposing sidewall of the gate cut multilayer structure is coplanar with an end of the second gate cap.

4. The semiconductor device of claim 1, further comprising:
a second gate structure upon the first dielectric material between a lower gate spacer and an upper gate spacer.

5. The semiconductor device of claim 4, wherein a bottom surface of the gate cut multilayer structure is coplanar with a bottom surface of the upper gate spacer.

6. The semiconductor device of claim 4, wherein a bottom surface of the gate cut multilayer structure is coplanar with a top surface of the lower gate spacer.

7. The semiconductor device of claim 4, wherein a thickness of the first high-k dielectric spacer is the same as a thickness of the second high-k dielectric spacer and is the same as a thickness of the upper gate spacer.

8. The semiconductor device of claim 4, further comprising:
a source and/or drain (S/D) contact between the first gate structure and the second gate structure.

9. A semiconductor device comprising:
a first gate conductor and a second gate conductor in line with the first gate conductor and upon a first dielectric material;
a gate cut region comprising a gate cut dielectric filling the gate cut region and directly upon an end of the first gate conductor and directly upon an end of the second gate conductor, wherein the gate cut dielectric is different from the first dielectric material;
a first gate cap upon at least a top surface of the first gate conductor and a second gate cap upon at least a top surface of the second gate conductor; and
a gate cut multilayer structure directly upon a top surface of the gate cut dielectric and between the first gate cap and the second gate cap, the gate cut multilayer structure comprising an inner dielectric composed of the first dielectric material between a first high-k dielectric vertical spacer and a second high-k dielectric vertical spacer, wherein a first sidewall of the gate cut multilayer structure is coplanar with the end of the first gate conductor and a second opposing sidewall of the gate cut multilayer structure is coplanar with the end of the second gate conductor, and wherein respective top surfaces of the first gate cap, the second gate cap, and the gate cut multilayer structure are substantially coplanar.

10. The semiconductor device of claim 9, wherein a bottom surface of the gate cut multilayer structure is above the top surface of the first gate conductor and is above the top surface of the second gate conductor.

11. The semiconductor device of claim 9, wherein the first sidewall of the gate cut multilayer structure is coplanar with an end of the first gate cap and the second opposing sidewall of the gate cut multilayer structure is coplanar with an end of the second gate cap.

12. The semiconductor device of claim 9, further comprising:
a third gate conductor between a lower gate spacer and an upper gate spacer.

13. The semiconductor device of claim 12, wherein a bottom surface of the gate cut multilayer structure is coplanar with a bottom surface of the upper gate spacer.

14. The semiconductor device of claim 12, wherein a bottom surface of the gate cut multilayer structure is coplanar with a top surface of the lower gate spacer.

15. The semiconductor device of claim 12, wherein a horizontal thickness of the first high-k dielectric spacer is the same as a horizontal thickness of the second high-k dielectric spacer and is the same as a horizontal thickness of the upper gate spacer.

16. A semiconductor device comprising:
   a first gate conductor and a second gate conductor in line with the first gate conductor and upon a first dielectric material;
   a gate cut region comprising a gate cut dielectric filling the gate cut region and directly upon an end of the first gate conductor and directly upon an end of the second gate conductor, wherein the gate cut dielectric is different from the first dielectric material; and
   a gate cut multilayer structure directly upon a top surface of the gate cut dielectric, the gate cut multilayer structure comprising an inner dielectric composed of the first dielectric material between a first high-k dielectric vertical spacer and a second high-k dielectric vertical spacer, wherein a first sidewall of the gate cut multilayer structure is coplanar with the end of the first gate conductor and a second opposing sidewall of the gate cut multilayer structure is coplanar with the end of the second gate conductor.

17. The semiconductor device of claim 16, wherein a top surface of the gate cut multilayer structure is above respective top surfaces of the first gate conductor and the second gate conductor.

18. The semiconductor device of claim 16, wherein a bottom surface of the gate cut multilayer structure is above a top surface of the first gate conductor and is above a top surface of the second gate conductor.

19. The semiconductor device of claim 16, further comprising:
   a first gate cap upon at least a top surface of the first gate conductor and a second gate cap upon at least a top surface of the second gate conductor.

20. The semiconductor device of claim 19, wherein the first gate cap, the second gate cap, and the gate cut dielectric are respectively composed of a same dielectric material.

* * * * *